(12) United States Patent
Toraichi et al.

(10) Patent No.: US 8,949,303 B2
(45) Date of Patent: Feb. 3, 2015

(54) FILTER

(75) Inventors: Kazuo Toraichi, Tsukuba (JP); Shuji Kawasaki, Tsukuba (JP)

(73) Assignee: Japanese Science and Technology Agency, Kawaguchi-Shi (JP)

( * ) Notice: Subject to any disclaimer, the term of this patent is extended or adjusted under 35 U.S.C. 154(b) by 1090 days.

(21) Appl. No.: 12/997,233

(22) PCT Filed: Jun. 1, 2009

(86) PCT No.: PCT/JP2009/059953
§ 371 (c)(1),
(2), (4) Date: Mar. 9, 2011

(87) PCT Pub. No.: WO2009/150949
PCT Pub. Date: Dec. 17, 2009

(65) Prior Publication Data
US 2011/0153704 A1    Jun. 23, 2011

(30) Foreign Application Priority Data

Jun. 10, 2008 (JP) ................................ 2008-151982
Aug. 4, 2008 (JP) ................................ 2008-200907

(51) Int. Cl.
*G06F 17/10* (2006.01)
*H03H 17/06* (2006.01)
*H03H 17/02* (2006.01)

(52) U.S. Cl.
CPC ........... *H03H 17/06* (2013.01); *H03H 17/0229* (2013.01)
USPC ...................................................... 708/319

(58) Field of Classification Search
CPC .......... H03H 17/0229; H03H 17/0285; H03H 17/0288; H03H 17/0289

USPC .................................................. 708/313, 319
See application file for complete search history.

(56) References Cited

U.S. PATENT DOCUMENTS 5,212,659 A   5/1993  Scott et al.
6,748,409 B1  6/2004  Toraichi
(Continued)

FOREIGN PATENT DOCUMENTS

EP    1 533 898 A1   5/2005
EP    1533898 A1    5/2013
(Continued)

OTHER PUBLICATIONS

D. Shpak, "A generalized Remez method for the design of FIR digital filters, " IEEE Trans. Circuits and Systems, vol. 37, No. 2, pp. 161-174, Feb. 1990.
(Continued)

*Primary Examiner* — Chuong D Ngo
(74) *Attorney, Agent, or Firm* — Franklin & Associates International Inc.; Matthew F. Lambrinos

(57) ABSTRACT

Provided is an FIR filter capable of obtaining predetermined characteristics with a small number of input taps, delay circuits, and multipliers and achieving an improved response and low cost. In a low-pass filter, a band-pass filter, and a high-pass filter based on an FIR filter, a basic filter is configured that gives a basic impulse response function and has a filter coefficient determined from the impulse response function. Filters having different frequency characteristics are configured by changing the time scale or frequency scale of the basic filter. These filters having different frequency characteristics are combined in a cascade form or a step form, thereby constructing an FIR filter having a small number of taps.

14 Claims, 45 Drawing Sheets

(56) References Cited

U.S. PATENT DOCUMENTS

| | | | |
|---|---|---|---|
| 7,330,865 B2* | 2/2008 | Koyanagi | 708/319 |
| 7,529,788 B2* | 5/2009 | Koyanagi | 708/319 |
| 2002/0171574 A1 | 11/2002 | Koyanagi | |
| 2005/0120067 A1 | 6/2005 | Koyanagi | |
| 2005/0171989 A1* | 8/2005 | Koyanagi | 708/301 |
| 2009/0070395 A1 | 3/2009 | Koyanagi | |

FOREIGN PATENT DOCUMENTS

| | | |
|---|---|---|
| JP | 01-273414 | 11/1989 |
| JP | 02-222319 | 9/1990 |
| JP | 06029786 A | 2/1994 |
| JP | 09-090967 | 4/1997 |
| JP | 63-269613 | 11/1998 |
| JP | 2001-102931 | 4/2001 |
| JP | 2001177412 A | 6/2001 |
| JP | 2006-020191 | 1/2006 |
| WO | 92/11696 A1 | 7/1992 |
| WO | 2004/008637 A1 | 1/2004 |
| WO | 2004036747 A1 | 4/2004 |
| WO | 2005078925 A1 | 8/2005 |
| WO | 2007102611 A1 | 9/2007 |

OTHER PUBLICATIONS

Hitoshi Honma, Yukio Mori, Masahiko Sagawa, "Low-Sensitivity Realization of Linear-Phase FIR Digital Filters Using Cascade Form," IEICE Trans., vol. J70-A, No. 5, pp. 766-774, May 1987.

Kouno, Takazawa, et al., "Design and Implementation of Oversampled Filter Banks for Multilevel FIR Filters with Low Aliasing," 229th workshop (Jun. 9, 2006), Tohoku Chapter, the Society of Instrument and Control Engineers, Document No. 229-8, pp. 1-11.

Takazawa, Abe, et al., "Design of a Filter Bank with Desired Frequency Response and Low Aliasing Noise," 215th workshop (May 27, 2004), Tohoku Chapter, the Society of Instrument and Control Engineers, Document No. 215-7, pp. 1-10.

Itami, Watanabe, et al, "A Realization of Oversampled Cosine Modulated Filter Banks with Perfect Reconstruction," IEICE Trans. A, vol. J83-A No. 9, pp. 1037-1046, Sep. 2000.

Masakazu Higuchi, et al, "A Design Method of Narrow Band FIR Filters Based on Fluency Sampling Function of Quadratic Piecewise Polynomial," WSEAS Trans. on Systems, Issue 6, vol. 8, pp. 733-742, Jun. 2009.

Kawasaki Shuji, et al, "A Design Method of Fluency FIR Filters with Steep Cut Off," IEEJ Trans. EIS, vol. 129, No. 3, pp. 406-417, Mar. 2009.

European extended search report dated Jun. 4, 2013 issued on European patent application No. 09762379.7 claiming priority from International Patent Application PCT/JP2009059953.

Nakamura K et al: "Design of FIR filter with small number of coefficients based on compactly supported fluency sampling function", 2003 IEEE Pacific Rim Conference on Communications, Computers and Signal Processing. (PACRIM 2003). Victoria, BC, Canada, Aug. 28-30, 2003; [IEEE Pacific Rim Conference on Communications, Computers and Signal Processing. PACRIM], New York, NY : IEE, vol. 1, Aug. 28, 2003, pp. 256-259, XP010660229, ISBN: 978-0-7803-7978-7.

Saramaki T et al: "Design and implementation of narrow-band linear-phase FIR filters with piecewise polynomial impulse response", IEEE Circuits and Systems, IEEE, Orlando, FL, vol. 3, May 30, 1999, pp. 456-461, XP010341009, DOI: 10.1109/ISCAS.1999.778882 ISBN: 978-0-7803-5471-5.

Yrja Neuvo et al: "Interpolated Finite Impulse Response Filters", IEEE Transactions on Acoustics, Speech and Signal Processing, IEEE Inc. New York, USA, vol. ASSP-32, No. 3, Jun. 1, 1984, pp. 563-570, XP001624250, ISSN: 0096-3518.

* cited by examiner

|  | Remez METHOD | PRESENT INVENTION |
|---|---|---|
| PASSBAND WIDTH | 7.29kHz | 5.58kHz |
| NUMBER OF TAPS | DIRECT CONFIGURATION 1707 (LOGICAL VALUE) 829 (AFTER QUANTIZATION) | 95 (CASCADE CONFIGURATION) |
| STOPBAND ERROR | LOGICAL VALUE: -80 dB OR LOWER AFTER QUANTIZATION: HIGHER THAN -80 dB ACROSS THE WHOLE RANGE | LOGICAL VALUE: -100 dB OR LOWER AFTER QUANTIZATION: -80 dB OR LOWER ALMOST ACROSS THE WHOLE RANGE |

(18 QUANTIZATION BITS)

FIG. 31

SPECIFICATIONS (NORMALIZING $f_S/2$ TO 1)

PASSBAND: 0 TO 9/100 ... FLATNESS OF ±3 [dB]
STOPBAND: 14/100 TO 1 ... −80 [dB] OR BELOW

FIG. 41

|  | NUMBER OF MULTIPLIERS | R |
|---|---|---|
| LEAST SQUARES METHOD: | 244 | 0.716 |
| Remez METHOD: | 1150 | 0.762 |
| METHOD OF PRESENT INVENTION: | 215 | 0.750 |
|  | 365 | 0.767 |

FIG. 44

FILTER

TECHNICAL FIELD

The present invention relates to filters, and more specifically, to a finite impulse response (FIR) filter having a small number of taps and steep attenuation characteristics.

BACKGROUND ART

With recent digitalization of multimedia information, the importance of arithmetic processing algorithms and arithmetic processing circuits that implement digital signal processing has been increasing. Especially, digital filters are used to eliminate noise, adjust frequency characteristics, separate signals, and so on. FIR filters having finite impulse response ensure stability always against bounded input. If the impulse response is symmetrical, the FIR filters can implement perfect linear phases. The linear phases are important characteristics in waveform transmission, measurement, sound reproduction, and so on. However, because of the trade-off between precision required in the frequency characteristics of the filter and the scale of the filter, high-order transfer characteristics are required to obtain steeper attenuation characteristics, and the circuit requires a large number of multipliers and delay elements. To create a pass-band filter with a very narrow band, for example, a very high degree of transfer characteristics is required, and a large number of multipliers are required accordingly.

In that context, many propositions have been made. Non-patent literature 1 describes the Remez method as a conventional method that has been used usually. Non-patent literature 2 describes a method of configuring a low-sensitivity linear-phase FIR filter by cascade connection, and the cascade connection allows the number of multipliers to be reduced. Patent literature 1 describes an FIR filter provided to vary the delay of the filter output signal.

Moreover, FIR filters for various uses such as filters for separating acoustic signal bands and filters for eliminating noise in image have been studied.

There are more conventional technologies. For example, non-patent literature 3 discloses the design and implementation of oversampled filter banks for multilevel FIR filters with low aliasing.

Non-patent literature 4 discloses a filter bank with desired frequency response and low aliasing noise. Non-patent literature 5 discloses a realization of oversampled cosine modulated filter banks with perfect reconstruction.

Patent literature 2 discloses a filter bank and filtering method that can efficiently implement critically sampled filter banks for real-value signals and especially a cosine modulated filter bank.

PRIOR ART REFERENCES

Non-Patent Literature

Non-patent literature 1: D. Shpak, "A generalized Remez method for the design of FIR digital filters," IEEE Trans. Circuit System, Vol. 37, No. 2, pp. 161-174, February 1990.
Non-patent literature 2: Hitoshi Honma, Yukio Mori, Masahiko Sagawa, "Low-Sensitivity Realization of Linear-Phase FIR Digital Filters Using Cascade Form," IEICE Trans., Vol. J70-A, No. 5, pp. 766-774, May 1987.
Non-patent literature 3: Kouno, Takazawa, et al., "Design and Implementation of Oversampled Filter Banks for Multilevel FIR Filters with Low Aliasing," 229th workshop (Jun. 9, 2006), Tohoku Chapter, the Society of Instrument and Control Engineers, Document No. 229-8, pp. 1-11
Non-patent literature 4: Takazawa, Abe, et al., "Design of a Filter Bank with Desired Frequency Response and Low Aliasing Noise," 215th workshop (May 27, 2004), Tohoku Chapter, the Society of Instrument and Control Engineers, Document No. 215-7, pp. 1-10
Non-patent literature 5: Itami, Watanabe, et al, "A Realization of Oversampled Cosine Modulated Filter Banks with Perfect Reconstruction," IEICE Trans. A, Vol. J83-A No. 9, pp. 1037-1046, September 2000

Patent Literature

Patent literature 1: Japanese Unexamined Patent Application Publication No. 2006-20191
Patent literature 2: Japanese Unexamined Patent Application Publication No. 2001-102931

DISCLOSURE OF INVENTION

Problems to be Solved by the Invention

In any conventional filter, however, the number of multipliers (number of multiplications in calculation by software) and the number of delay elements (number of memories in processing by software) have not been reduced dramatically.

For example, according to non-patent literature 1, extensive numbers of multipliers and delay elements are required to implement a filter having steep attenuation characteristics. According to non-patent literature 2, low-sensitivity filters can be realized, but the technology is not suitable for filters having steep attenuation characteristics.

A high-performance filter having steep attenuation characteristics configured by any conventional method requires extensive numbers of input taps, delay circuits, and multipliers, and it has taken very long until filter output with predetermined characteristics becomes stable.

Music, video, and other multimedia data distributed recently in MP3 (audio compression), MPEG (video compression), and other forms involves problems such as the deluge of information and quality lowered by jaggies. The compression processing includes band separation in the frequency domain, which requires excessive numbers of multipliers and delay elements.

Since the conventional REMEZ filter uses the SINC function (function over the infinite interval) as the basic function, reduction to a finite interval is needed in the actual circuit and is known as one possible cause of noise.

In view of the problems described above, it is an object of the present invention to provide a filter that can exhibit designated characteristics with reduced numbers of input taps, delay circuits, and multipliers, can improve the response, and can lower the cost.

Another object of the present invention is to provide a low-cost FIR filter with high noise elimination characteristics.

A further object of the present invention is to provide an FIR filter that does not generate jaggies and is suitable for signal processing.

FIR filters can be used in a variety of apparatuses such as audio apparatuses including amplifiers, image apparatuses for moving or still image processing, communication apparatuses including mobile phones, control apparatuses, PCs and other computers.

Means for Solving the Problems

Since one main feature of the present invention is that the basic function is an impulse response function expressed by an n-th-degree piecewise polynomial having a finite support, and nodal values of the function are used as filter coefficients, a filter configured according to the present invention samples the input signal at a smaller number of points, in comparison with a filter using the conventional SINC function as the basic function, and can exhibit frequency characteristics without support reduction error or aliasing error.

Another feature of the present invention is that the n-th-degree piecewise polynomial needs to be a quadratic to quartic function, and the frequency characteristics in the passband are flat with reduced ripples and have linear phases.

Another feature of the present invention is that scaling the basic filters in frequency allows the passband to be narrowed in accordance with the scaling value and increases the number of zero points, consequently increasing the attenuation degree in the stopband.

A further feature of the present invention is the cascade connection of scaled filters, which allows a high-performance filter to be configured with a reduced number of multipliers.

An additional feature of the present invention is that the cascade connection of the scaled filters means the combination of low-pass and high-pass scaled filters having a desired passband or a wider passband and ensures desired cutoff frequencies.

A further additional feature of the present invention is that since scaled filters are selected depending on the attenuation degree in the stopband, a very high attenuation degree can be provided in the stopband.

According to a first solving means of the present invention, a filter providing desired characteristics is provided by combining a basic low-pass filter or a basic high-pass filter using a nodal value of an impulse response function configured by a piecewise polynomial with a finite support as a filter coefficient; and a plurality of scaled filters formed by scaling the basic filter in the time domain or the frequency domain.

According to a second solving means of the present invention, a filter formed like a filter B(z) expressed by the equation given below is provided by connecting low-pass filters $L_p$ and high-pass filters $H_q$ in cascade as indicated by the equation given below, the filters $L_p$ being formed by scaling a basic low-pass filter which uses nodal values of the impulse response function configured by a piecewise polynomial with a finite support as filter coefficients, by p+1 (p being an integer larger than or equal to zero, and p being 0 for the basic filter) in the time domain or frequency domain, the filters $H_q$ being formed by scaling a basic high-pass filter which uses the filter coefficients with their signs inverted alternately, by q+1 (q being an integer larger than or equal to zero, and q being 0 for the basic filter) in the time domain or frequency domain.

$$B(z) = B_0(z) \prod_{p=0}^{P} L_p^{\alpha_p}(z) \cdot \prod_{q=0}^{Q} H_q^{\beta_q}(z), \quad \alpha_p, \beta_q \in N_0 \quad \text{[Expression 1]}$$

$$B_0(z) = L_M(z) \text{ or } H_M(z)$$

$$L_p(z) = L_0(z^{p+1}), \quad H_q(z) = H_0(z^{q+1})$$

The subscripts and superscripts indicate the following:

$\alpha_p, \beta_q$: Exponential value (indicating that identical $L_p$ or $H_q$ is connected $\alpha_p$ or $\beta_q$ times)

P, Q: Maximum values of scaling values p and q

According to a third solving means of the present invention, a filter is provided with a basic configuration in which signals delayed by multiplying discrete input in a finite interval by a coefficient are added sequentially and scaled filters formed by increasing or decreasing the number of delay elements in the basic configuration, the scaled filters being connected in cascade to output the signals.

According to a fourth solving means of the present invention, an FIR filter providing desired characteristics is provided by combining a basic low-pass filter or a basic high-pass filter using a nodal value of an impulse response function configured by a piecewise polynomial with a finite support as a filter coefficient; and a plurality of scaled filters formed by scaling the basic filter in the time domain or the frequency domain;

wherein a center frequency, a cutoff frequency, a stopband frequency, the maximum attenuation degree in a stopband, and a sampling frequency are input;

the maximum scaling degree is determined from a passband frequency width determined by the cutoff frequency and the center frequency;

scaled filters having a degree lower than the maximum scaling degree are sequentially selected;

it is determined whether scaled filters selected to keep an attenuation degree at the stopband frequency of the FIR filter to be obtained lower than or equal to the maximum attenuation degree are employed; and the FIR filter is configured by a cascade connection of the scaled filters.

According to a fifth solving means of the present invention, a filter is provided by connecting a passband filter $G_{pass}$ and a stopband filter $G_{stop}$ in cascade, the passband filter $G_{pass}$ being formed by a cascade connection of a basic low-pass filter $L_0$ using nodal values of a sampling function expressed by a finite piecewise polynomial as filter coefficients, a plurality of low-pass filters $L_M$ formed by scaling the basic low-pass filter in frequency, a basic high-pass filter $H_0$ using the filter coefficients with their signs inverted alternately, and a plurality of high-pass filters $H_M$ formed by scaling the basic high-pass filter in frequency, as given by the equation below:

$$G_{pass} = L_{P,N_P{(1)}}{}^{\alpha_P}[1 - H_{P,N_P{(2)}}]^{\beta_P} \quad \text{[Expression 2]}$$

where the subscripts and superscripts of $G_{pass}$ indicate the following:

$\alpha_P, \beta_P$: Exponential value (indicating that identical $L_{P,N1}$ or $[1-H_{P,N2}]$ is connected $\alpha_P$ or $\beta_P$ times. Here, $N1=N_P{}^{(1)}$ and $N2=N_P{}^{(2)}$ for the sake of convenience of description), $N_P{}^{(1)}$: Number of $H_P$ ladder connections in $L_{P,N1}$, $N_P{}^{(2)}$: Number of $L_P$ ladder connections in $[1-H_{P,N2}]$, P: Filter formed by scaling by P+1 in frequency;

the stopband filter $G_{stop}$ being formed by a cascade connection of the basic low-pass filter $L_o$, the low-pass filters $L_M$, the basic high-ass filter $H_0$, and the high-pass filters $H_M$, as given by the equation below:

$$G_{stop} = \left[ \prod_{k=1}^{K} L_{p_k, N_k}^{\alpha_k} \right] \cdot \prod_{l=1}^{L} [1 - H_{q_l, N_l}]^{\beta_l} \quad \text{[Expression 3]}$$

where, $\alpha_k$, $\beta_j$: Exponential value (indicating that identical $L_{pk,Nk}$ or $[1-H_{ql,Nl}]$ is connected $\alpha_k$ or $\beta_l$ times), $N_k$: Number of $H_p$ ladder connections in $L_{pk,Nk}$, $N_l$: Number of $L_p$ ladder connections in $[1-H_{ql,Nl}]$.

$p_k$, $q_l$: Filters formed by scaling by $p_k+1$ and by $q_l+1$ in frequency.

According to a sixth solving means of the present invention, a filter is provided on the basis of a low-pass filter and a high-pass filter which use nodal values of an impulse response function expressed by a piecewise polynomial with a finite support as coefficients, and the filter passband characteristics are formed by selecting scaled filters formed by scaling the low-pass filter and the high-pass filter in frequency to provide a passband width larger than or equal to a predetermined required width, by using the selected scaled filters to choose a scaled low-pass filter that satisfies required characteristics, and by connecting the scaled high-pass filters to the chosen scaled low-pass filter in a ladder manner.

According to a seventh solving means of the present invention, a filter is provided on the basis of a low-pass filter and a high-pass filter which use nodal values of an impulse response function expressed by a piecewise polynomial with a finite support as coefficients, and the filter passband characteristics are formed by selecting scaled filters formed by scaling the low-pass filter and the high-pass filter in frequency to provide a passband width larger than or equal to a predetermined required width, by using the selected scaled filters to choose a scaled high-pass filter that satisfies required characteristics, and by connecting the scaled low-pass filters to the chosen scaled high-pass filter in a ladder manner.

Advantages of the Invention

According to the present invention, low-pass filters, high-pass filters, and band-pass filters that have reduced numbers of taps, delay circuits, and multipliers and exhibit excellent frequency separation can be implemented because the filters are configured by scaled filters formed by scaling basic filters with steep attenuation characteristics. Since the attenuation degree in the stopband can be increased, a filter with a high noise reduction capability can also be implemented according to the present invention. Since the number of taps (multipliers) can be reduced greatly in comparison with conventional filters, a low-cost filter can be provided according to the present invention.

BRIEF DESCRIPTION OF THE DRAWINGS

FIG. 31 shows the evaluation of a filter according to the present invention in comparison with required specifications.

FIG. 41 is an illustration of the specifications of a low-pass filter.

FIG. 44 is a view comparing the number of multipliers and R of the design methods.

EMBODIMENTS FOR CARRYING OUT THE INVENTION

To give a better understanding of the present invention, an embodiment will be described.

1. Filter Configuration

Figure 3:
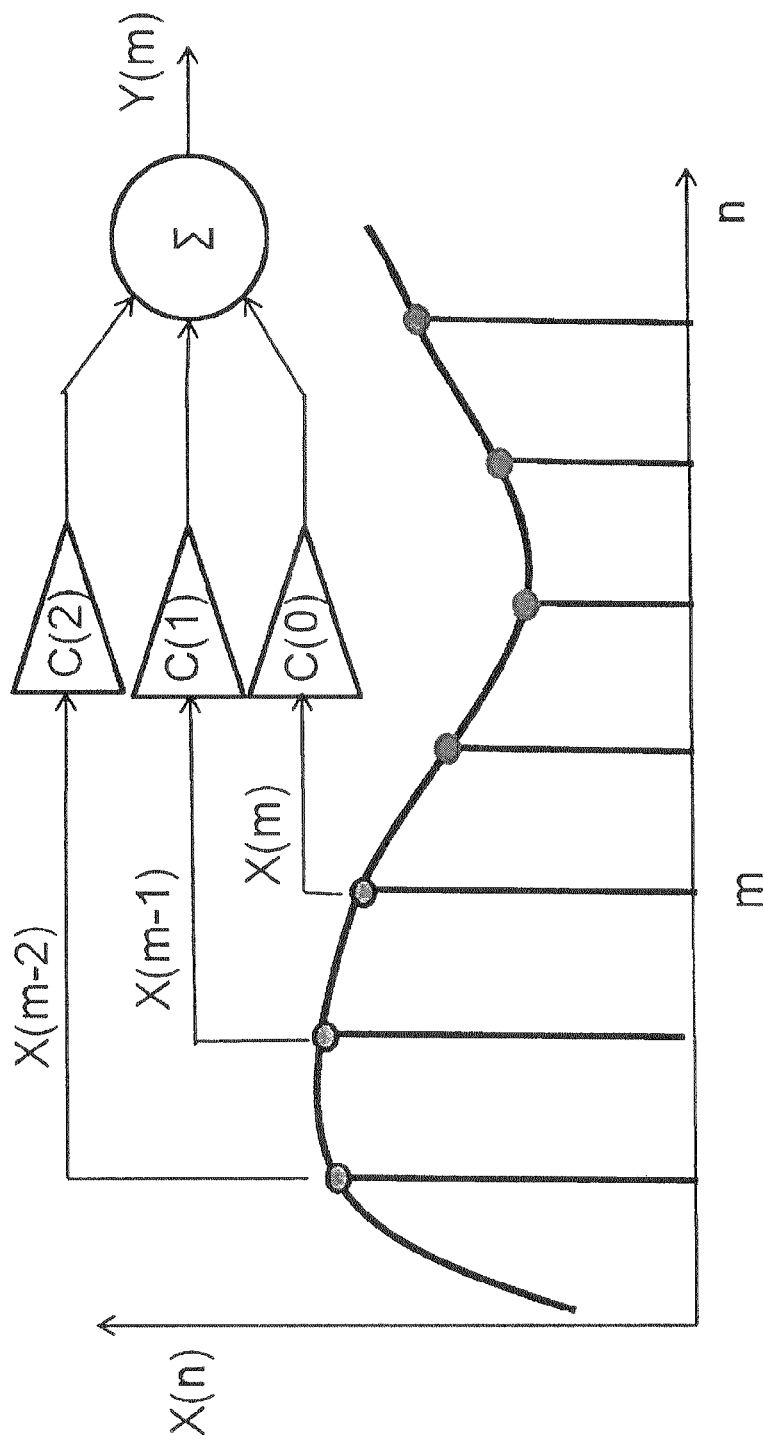
FIG. 3 is a schematic illustration of filter processing in the embodiment.

FIG. 3 is an outlined illustration of filter processing.

A non-recursive digital filter is also called a finite impulse response (FIR) filter since the impulse response is expressed by a finite number of pulses.

Generally, an FIR filter can be obtained from an input-output relationship as shown below, by multiplying the past and current input signals X(m) by a predetermined coefficient (filter coefficient) C(k), as shown in FIG. 3, where X(m) is an input signal and Y(m) is an output signal.

$$Y(m) = \prod_{k=0}^{p} C(k)x(m-k) = \prod_{k=0}^{p} C(k)X(m)z^{-k} \quad \text{[Expression 4]}$$

here, $$L(z) = \prod_{k=0}^{p} C_k z^{-k}$$

The second expression is referred to as an FIR low-pass filter, where $C_k = C(k)$.

Figure 4:
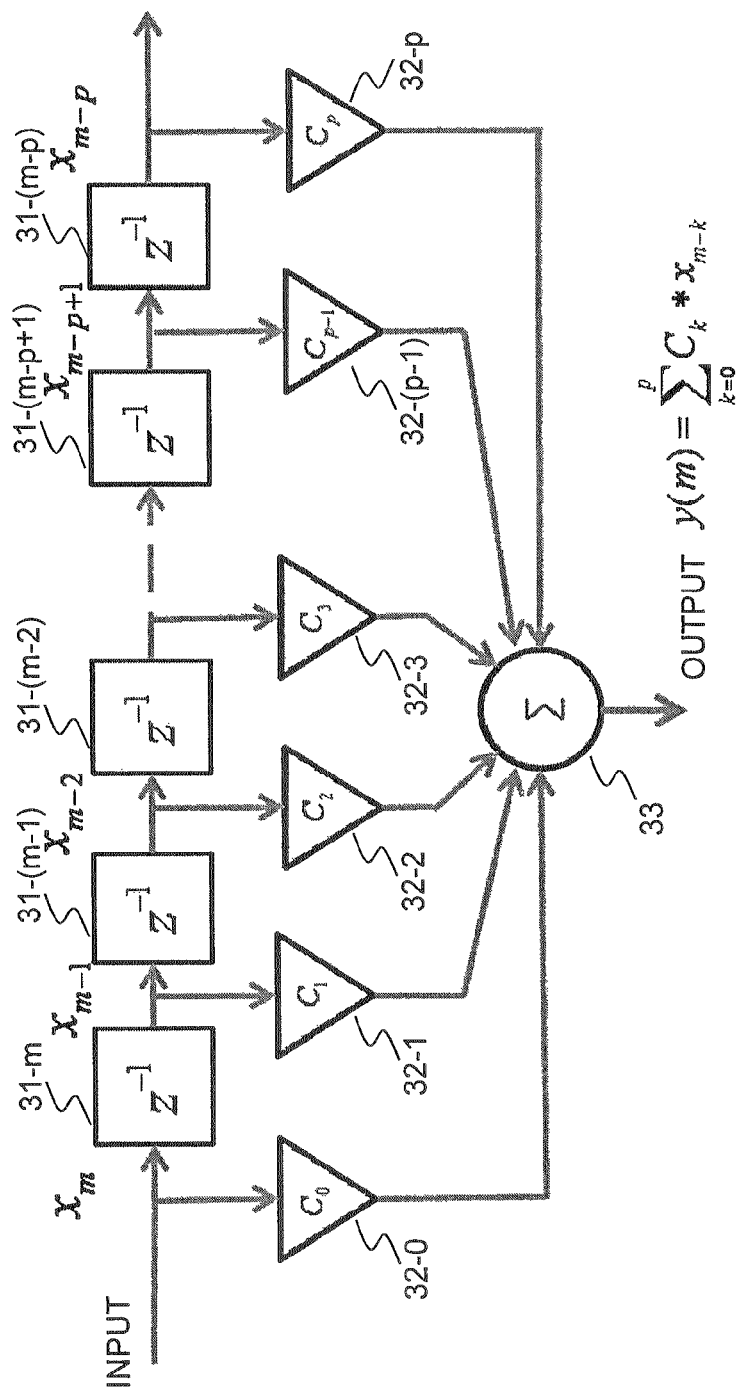
FIG. 4 is a structural view of a general filter in the embodiment.

FIG. 4 is a structural view of the filter.

The filter includes delay elements 31-$m$ to 31-($m$-$p$), multipliers 32-0 to 32-$p$ having filter coefficients $C_0$ to $C_p$, respectively, and an adder 33.

A high-pass filter is expressed by the expression below.

$$H(z) = \sum_{k=-\infty}^{\infty} C_k (-z)^k \quad \text{[Expression 5]}$$

The filter coefficients $C_k$ of the low-pass filter and high-pass filter given above are derived from the impulse response function.

Figure 5:
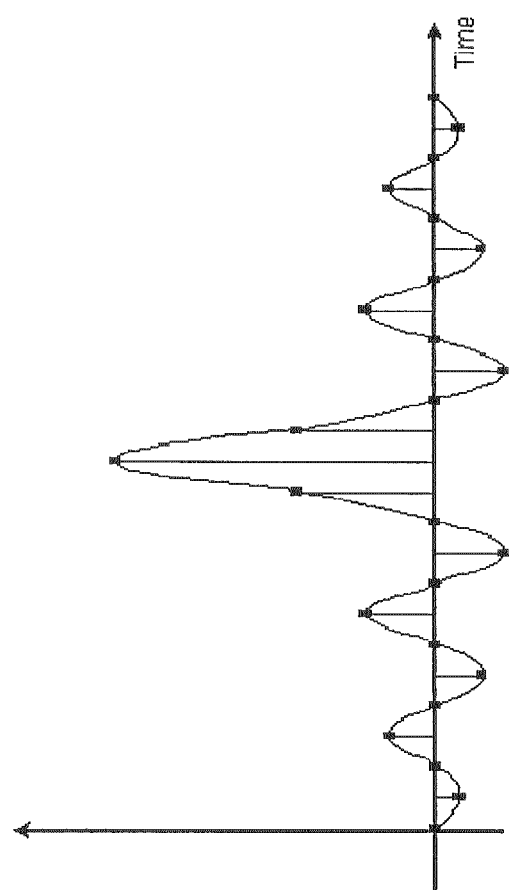
FIG. 5 is a view showing the waveform of a conventional impulse response function in the embodiment.

FIG. 5 is a view showing the waveform of a conventional impulse response function.

A SINC function shown in FIG. 5 has been applied as the conventional impulse response function, and the function value at the middle point of the distance between samples has been utilized as a filter coefficient $C_k$. The SINC function, however, is a function of infinite interval, and an infinite number of filter coefficients $C_k$ are required ideally. An actual filter must have a finite number of coefficients, but a very large number of coefficients are required to ensure certain precision in spite of an error caused by the reduction of coefficients.

Figure 6:
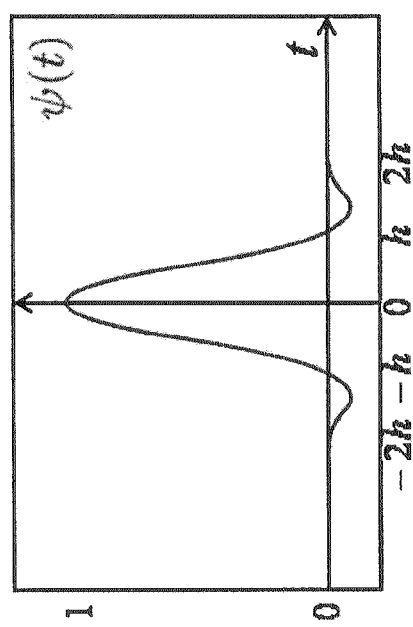
FIG. 6 is a view showing the waveform of an impulse response function according to the embodiment.

FIG. 6 is a view showing the waveform of an impulse response function according to the embodiment.

This embodiment uses an impulse response function having a finite support as shown in FIG. 6. Given below is an example of the function obtained by shifting the B-spline function at intervals of a half of the distance between sample points and performing synthesized approximation.

$$\psi(t) = -\frac{h}{2}\phi\left(t+\frac{h}{2}\right) + 2h\phi(t) - \frac{h}{2}\phi\left(t-\frac{h}{2}\right) \quad \text{[Expression 6]}$$

$$\phi(t) \triangleq \int_{-\infty}^{\infty} \left\{\frac{\sin(\pi f h)}{\pi f h}\right\}^3 e^{j2\pi f t} df$$

where
h: Sampling time interval
f: Frequency

According to Japanese Unexamined Patent Application Publication No. 2001-842442, the function given above can be approximated by piecewise polynomials shown in the equation given below.

$$\phi(t) = \begin{cases} -\frac{t^2}{4} - t - 1 & -2 \leq t \leq -\frac{3}{2} \\ \frac{3t^2}{4} + 2t + \frac{5}{4} & -\frac{3}{2} \leq t \leq -1 \\ \frac{5t^2}{4} + 3t + \frac{7}{4} & -1 \leq t \leq -\frac{1}{2} \\ -\frac{7t^2}{4} + 1 & -\frac{1}{2} \leq t \leq \frac{1}{2} \\ \frac{5t^2}{4} - 3t + \frac{7}{4} & \frac{1}{2} \leq t \leq 1 \\ \frac{3t^2}{4} - 2t + \frac{5}{4} & 1 \leq t \leq \frac{3}{2} \\ -\frac{t^2}{4} + t - 1 & \frac{3}{2} \leq t \leq 2 \end{cases} \quad \text{[Expression 7]}$$

Figure 7:
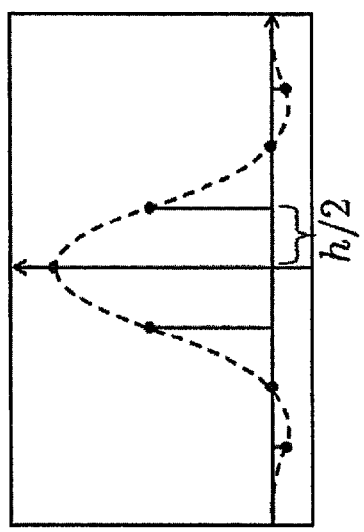
FIG. 7 is an illustration of a discrete impulse response and filter coefficient values in the embodiment.

FIG. 7 is an illustration of a discrete impulse response and filter coefficient value of the embodiment.

A black dot in the figure indicates a sample point (singular point) in the impulse response function with finite support. When the shown function ψ(t) is given as the waveform of impulse response having a finite support, if the value of the black dot on the vertical axis is given as the filter coefficient (tap coefficient) C(k) with the filter delay time treated as a half of the sampling time width h, the waveform of the lowest-degree impulse response is reproduced. A filter having this filter coefficient C(k) is called a basic low-pass filter $L_0$.

With the shown function ψ, the basic low-pass filter is expressed as follows.

In the equation given above, the value of ψ(t) at connection points at intervals of h/2 in each section as shown in FIG. 7 is taken as the coefficient C(k), with the following settings being taken into account C(0) = ψ(−1.5) = −1/16
C(1) = ψ(−1.0) = 0
C(2) = ψ(−0.5) = 9/16
C(3) = ψ(0) = 1
C(4) = ψ(0.5) = 9/16
C(5) = ψ(1.0) = 0
C(6) = ψ(1.5) = −1/16

The basic low-pass filter $L_0(z)$ is expressed by the following equation.

$$L_0(z) = \sum_{k=0}^{6} C(k) z^{-k} \quad \text{[Expression 8]}$$

$$C(k) = \psi((k-3)\tau)$$

$$\tau = h/2$$

From the definition given above, $L_o(z)$ is expressed as follows.

$$L_0(z) = \sum_{k=0}^{6} C(k)z^{-k} = C(0) + C(1)z^{-1} + C(2)z^{-2} + C(3)z^{-3} + C(4)z^{-4} + C(5)z^{-5} + C(6)z^{-6} = -\frac{1}{16} + \frac{9}{16}z^{-2} + z^{-3} + \frac{9}{16}z^{-4} - \frac{1}{16}z^{-6}$$ [Expression 9]

The frequency characteristics of the basic low-pass filter are expressed by the equation given below.

$$L_0(f) = e^{-j6\pi f}\left(\frac{C(3)}{2} + \sum_{k=0}^{2} C(k)\cos(2k\pi f)\right)$$ [Expression 10]

Figure 8:
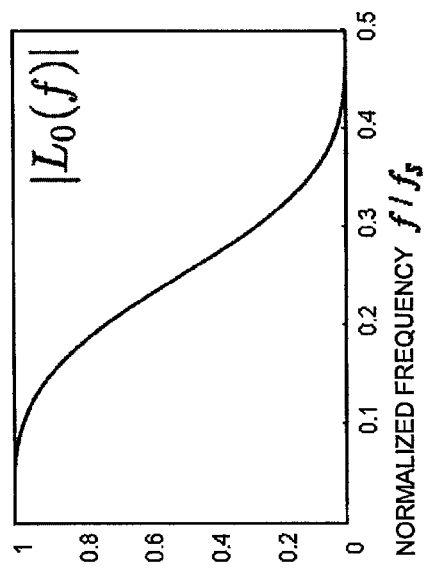
FIG. 8 is a view showing an example of the frequency response of a low-pass filter in the embodiment.

FIG. 8 is a view showing an example of the frequency response of the low-pass filter of the embodiment. The figure shows the characteristics expressed by the equation given above.

Figure 9:
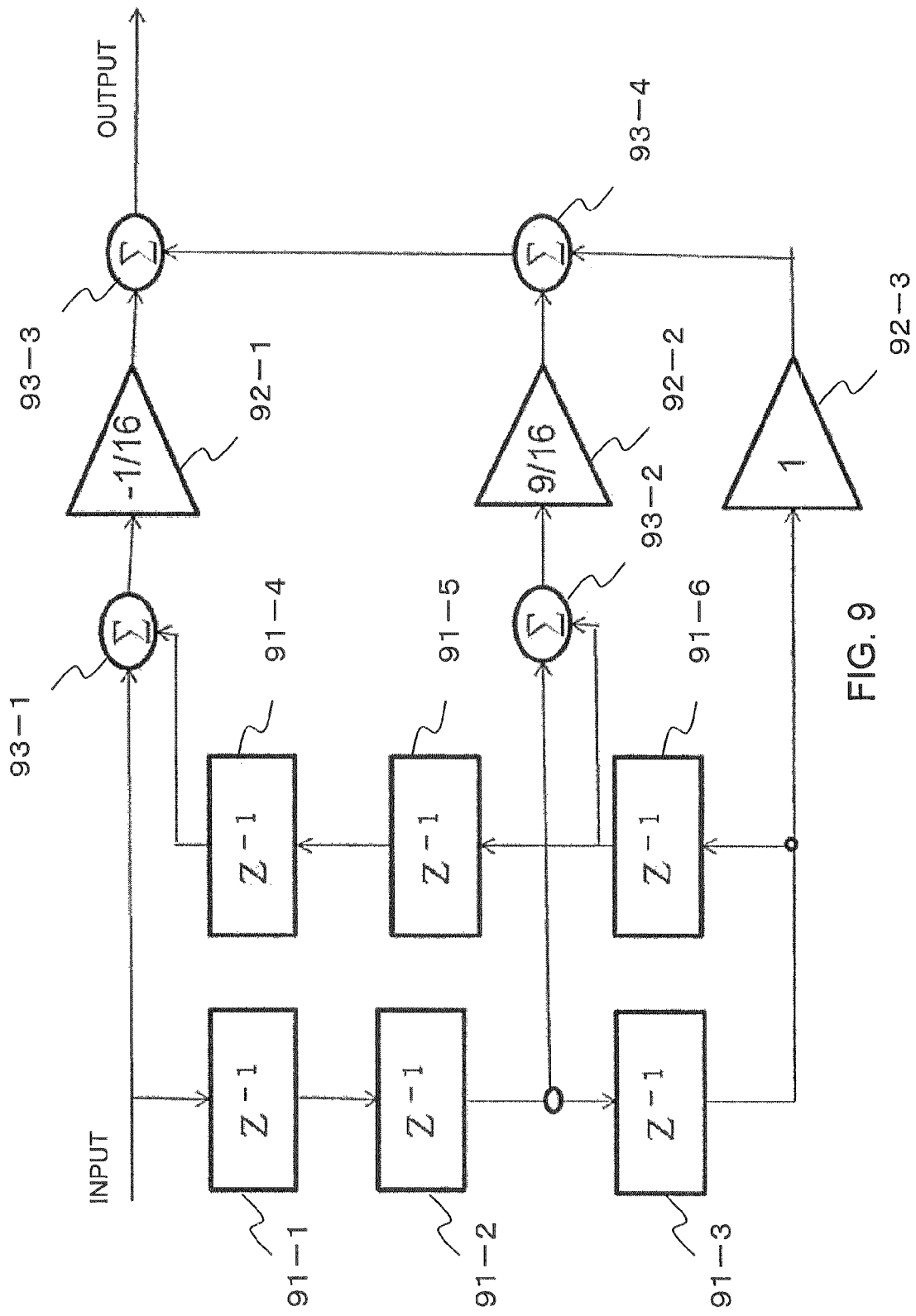
FIG. 9 is a structural view of a basic low-pass filter in the embodiment.

FIG. 9 is a structural view of the basic low-pass filter of the embodiment.

An example of the arithmetic circuit of the basic low-pass filter $L_0$ is configured as shown in FIG. 9.

The basic low-pass filter includes delay elements 91-1, 91-2, 91-3, 91-4, 91-5, and 91-6, multipliers 92-1, 92-2, and 92-3, and adders 93-1, 93-2, 93-3, and 93-4. The filter coefficients of the multipliers 92-1, 92-2, and 92-3 are $-\frac{1}{16}$, $\frac{9}{16}$, and 1, respectively. The multiplier 92-3 can be omitted because the coefficient is 1.

Based on the low-pass filter $L_0(z)$, a basic high-pass filter $H_0(z)$ can be expressed by the following equation.

$$H_0(z) = -L_0(-z) = -\sum_{k=0}^{6} b(k)z^{-k}$$

$$b(k) = (-1)^k C(k)$$

[Expression 11]

Figure 10:
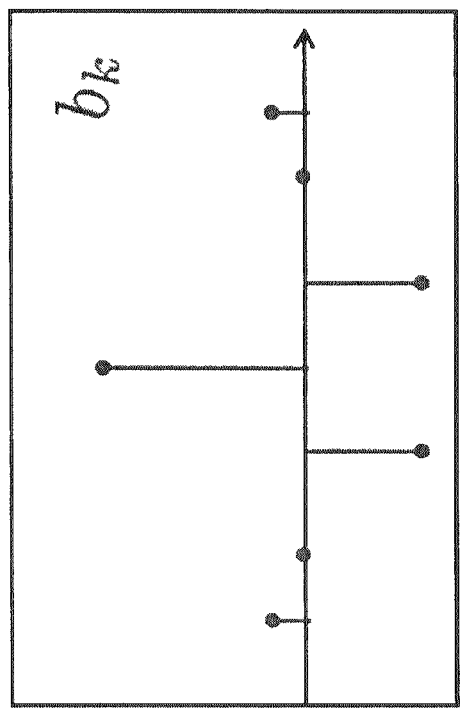
FIG. 10 is an illustration of the discrete impulse response and filter coefficient values of a basic high-pass filter in the embodiment.

FIG. 10 is an illustration of the discrete impulse response and filter coefficient value of the basic high-pass filter of the embodiment.

The coefficient b(k) in the equation given above is obtained by inverting the sign of the coefficient C(k) alternately as shown in FIG. 10.

Figure 11:
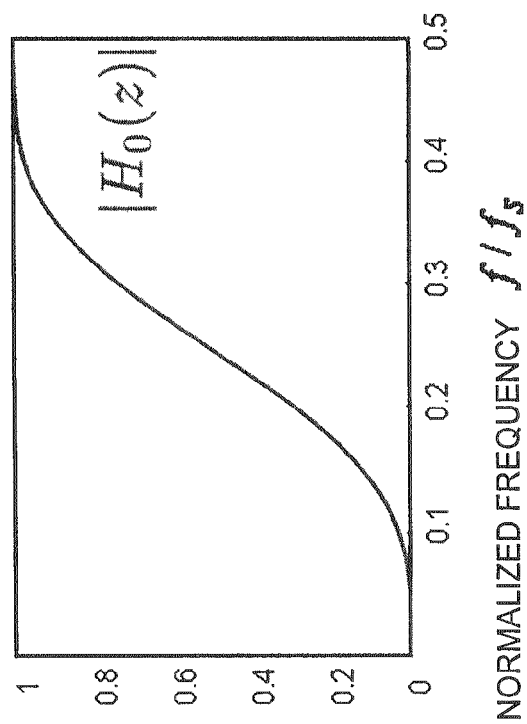
FIG. 11 is a view showing an example of the frequency response of the basic high-pass filter in the embodiment.

FIG. 11 is a view showing an example of the frequency response of the basic high-pass filter of the embodiment.

The high-pass filter $H_0(z)$ has frequency characteristics shown in FIG. 11 and can be expressed by the equation given below.

$$H_0(f) = e^{-j6\pi f}\left(\frac{C(3)}{2} - \sum_{k=0}^{2}(-1)^k C(k)\cos(2k\pi f)\right)$$ [Expression 12]

The reason for using the impulse response functions such as the Fluency DA function is that the local support allows filter coefficients to be used in the range of finite numbers and that the even function (linear phase) can implement a linear phase. In addition, the maximally flat characteristics can solve a ripple problem in the passband.

2. Scaled Filter (1) Scaling

In comparison with the basic filters described above, a filter with a time base multiplied by M+1, or a filter having a delay time interval multiplied by 1/(M+1) will now be considered. In other words, a filter scaled in the frequency domain as given by the equation given later is defined. $L_M(z)$ and $H_M(z)$ are obtained by scaling $L_0(z)$ and $H_0(z)$, respectively by M+1, where M is referred to as a scaling factor.

On the basis of the basic low-pass filter $L_0(z)$ and basic high-pass filter $H_0(z)$, described above, filters scaled in the frequency domain will be defined next.

A low-pass filter $L_M(z)$ and a high-pass filter $H_M(z)$ obtained by scaling the basic low-pass filter $L_0(z)$ and the basic high-pass filter $H_0(z)$ by M+1 can be expressed respectively by the following equations.

$$L_M(z)=L_0(z^{M+1})$$

$$H_M(z)=H_0(z^{M+1})$$ [Expression 13]

Figure 12:
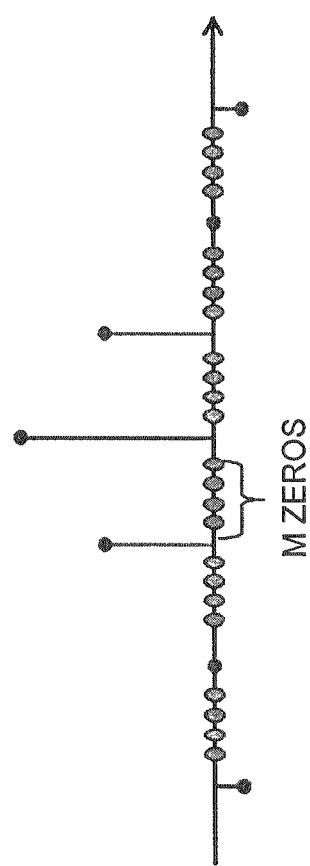
FIG. 12 is an illustration of scaling by M in the embodiment.

FIG. 12 is an illustration of scaling by M in the embodiment.

As the equations given above indicate, scaling in the frequency domain corresponds to upsampling in the time domain.

The low-pass filter $L_M(z)$ and high-pass filter $H_M(z)$ are obtained by upsampling M times in the time domain as shown in FIG. 12, which corresponds to insertion of M zeros between sample points.

Figure 13:
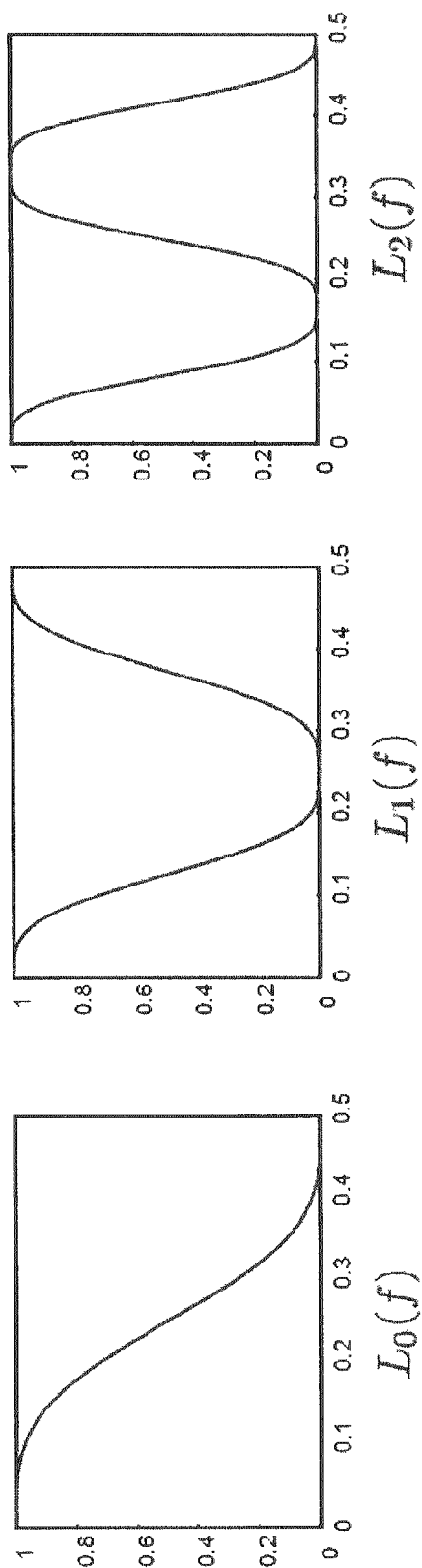
FIG. 13 is an illustration of a scaled filter in the embodiment.

FIG. 13 is an illustration of scaled filters in the embodiment.

Examples of the frequency characteristics of the low-pass filter $L_M(z)$ are shown in FIG. 13.

The figure shows the characteristics of filters $L_1$ and $L_2$ obtained by scaling the basic low-pass filter $L_0$ by 2 and 3, respectively.

The basic filter $L_0$ is scaled to the filter $L_1$ as shown in the figure, and the filter $L_1$ is scaled to the filter $L_2$ as shown in the figure. A filter $L_3$ and subsequent filters are obtained likewise by scaling.

The configuration of an example arithmetic circuit of $L_M(z)$ will now be described. A filter $L_p(z)$ formed by scaling by p+1 will be described below.

Figure 2:
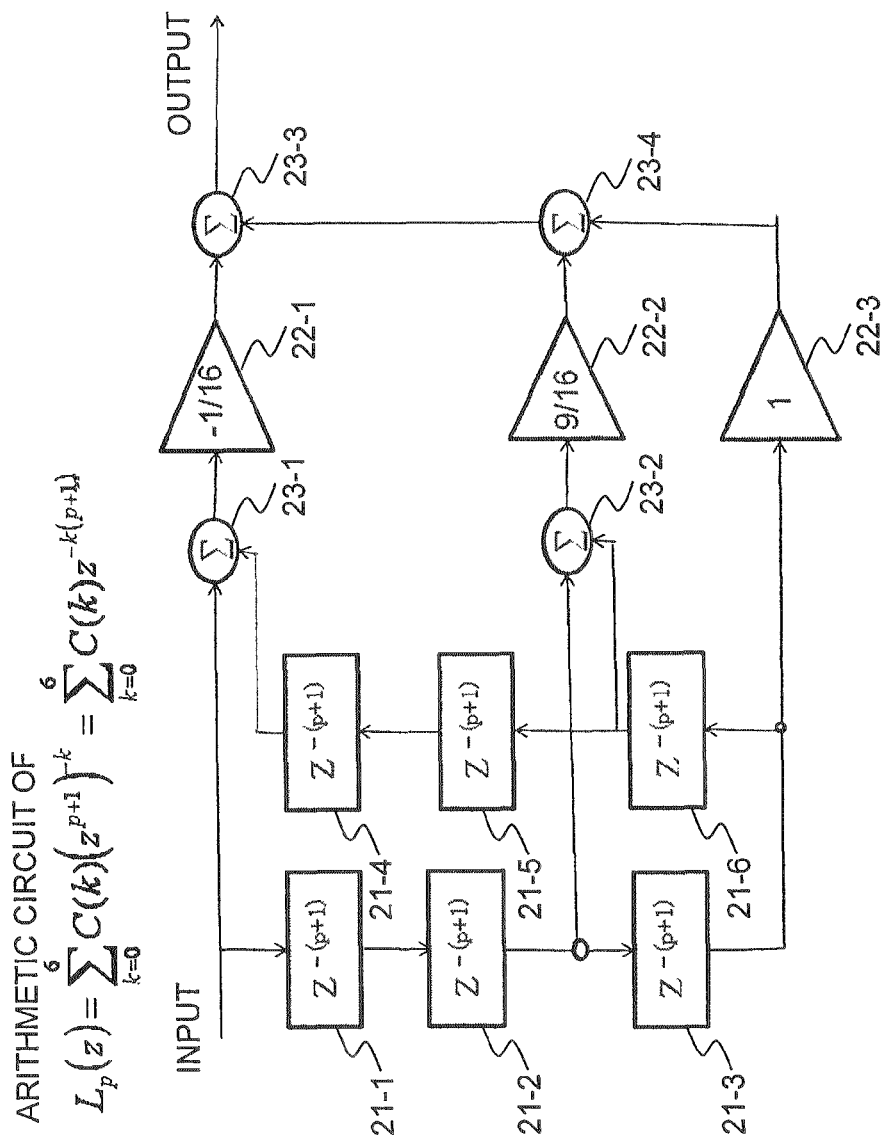
FIG. 2 is a structural view of a scaled element filter in the embodiment.

FIG. 2 is a structural view of a scaled element filter in the embodiment. The figure shows a filter formed by scaling the basic filter by p+1.

The basic low-pass filter has delay elements 21-1, 21-2, 21-3, 21-4, 21-5, and 21-6 that cause a delay of p+1 samples, multipliers 22-1, 22-2, and 22-3, and adders 23-1, 23-2, 23-3, and 23-4. The filter coefficients of the multipliers 22-1, 22-2, and 22-3 are $-\frac{1}{16}$, $\frac{9}{16}$, and 1, respectively. The multiplier 22-3 can be omitted because the coefficient is 1.

This filter has an arithmetic circuit implementing the following equation.

$$Lp(z) = \sum_{k=0}^{6} C(k)(z^{p+1})^{-k} = \sum_{k=0}^{6} C(k)z^{-k(p+1)}$$ [Expression 14]

3. Cascade Connection of Filters

Figure 1:
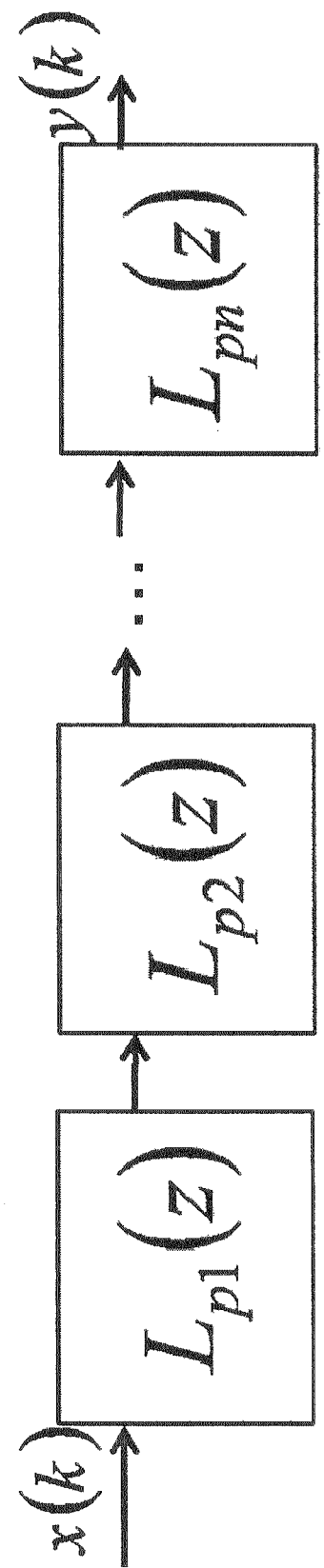
FIG. 1 is a structural view of a filter according to an embodiment.

FIG. 1 is a structural view of an example filter having a cascade connection of low-pass filters to implement the embodiment.

The filter has n low-pass filters $L_{pk}(z)$ connected in cascade. The low-pass filter $L_{pk}(z)$ is an element filter formed by scaling the basic low-pass filter $L_0(z)$. Scaling is to define a filter by multiplying the basic filter by pk+1 in the frequency domain or time domain.

The shown configuration includes just scaled filters based on the low-pass filter. However, a configuration that includes high-pass filters alone or both high-pass filters and low-pass filters, which will be described later, is within the scope of this embodiment.

Figure 14:
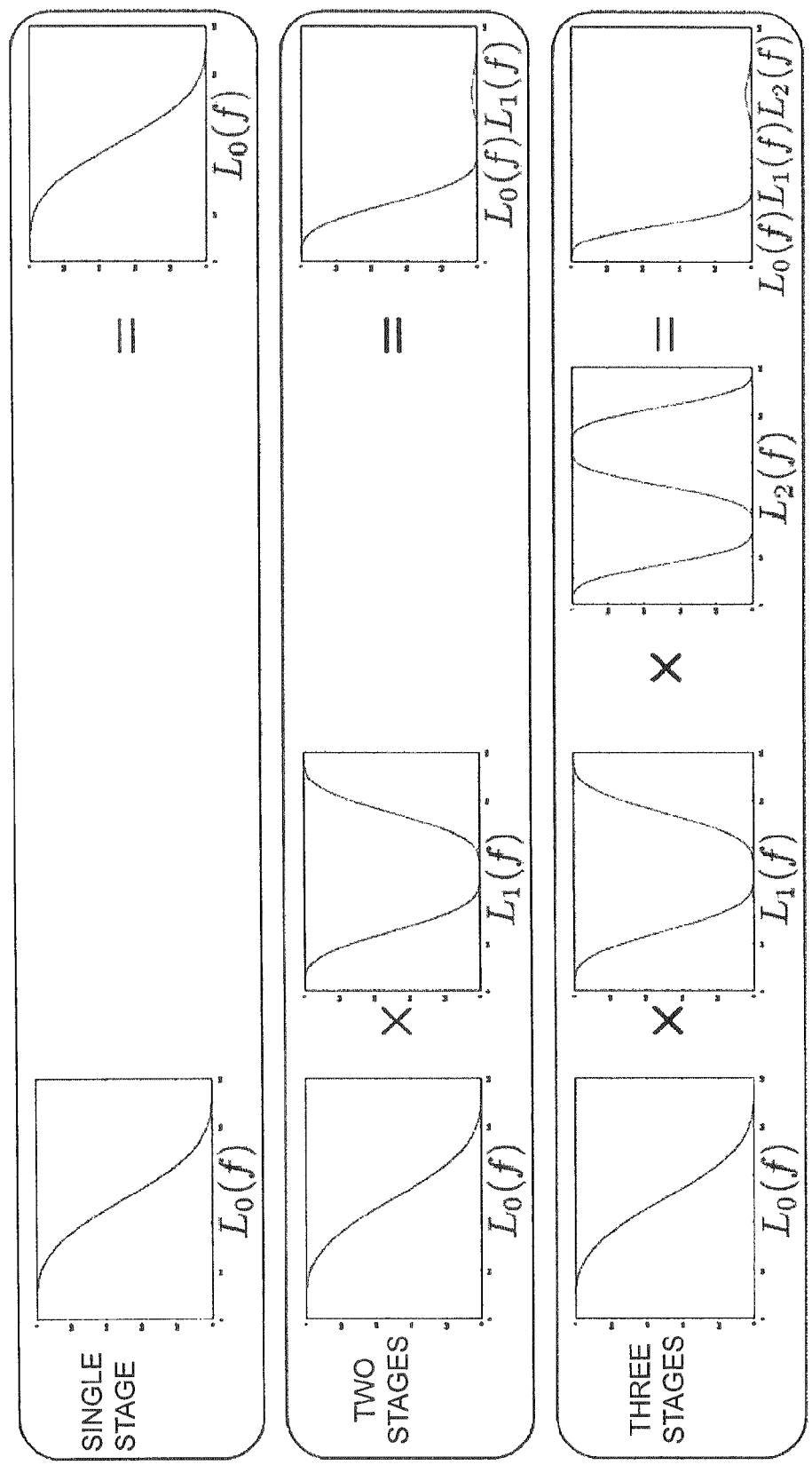
FIG. 14 is a view illustrating a cascade connection configuration and showing an example of its frequency response in the embodiment.

FIG. 14 is an illustration of variations in frequency characteristics caused by cascade connections of the basic filters.

By connecting scaled low-pass filters $L_{pk}(z)$ in cascade as shown in FIG. 1, filters having the frequency characteristics shown in FIG. 14, for example, can be implemented. The cascade connection of scaled filters makes it possible to narrow the passband width and to lower the stopband sufficiently and creates other new characteristics.

In the figure, the filter of a single stage is the basic filter $L_0$; the filter of two stages includes the basic filter $L_0$ and the filter $L_1$ connected in cascade; the filter of three stages includes the basic filter $L_0$, the filter $L_1$, and the filter $L_2$ connected in cascade. As shown in the figure, the cascade connection of scaled filters can narrow the passband width and can also lower the stopband.

The examples described above include just low-pass filters, but generally, a variety of filters X(z) can be configured by combining low-pass filters and high-pass filters. The filter X(z) can be expressed generally by the equation below.

$$X(z) = X_0(z) \prod_{p=1}^{P} L_p^{\alpha_p}(z) \cdot \prod_{q=1}^{Q} H_q^{\beta_q}(z), \quad \text{[Expression 15]}$$

$$\alpha_p, \beta_q \in N_0$$

$$L_p(z) = L_0(z^{p+1}), \quad H_q(z) = H_0(z^{q+1})$$

$L_0$ is the basic low-pass filter (mother filter).

$H_0$ is the basic high-pass filter (mother filter).

p and q are scaling values (scaling factors). In other words, a scaled filter is formed by scaling the frequency by p+1 or q+1.

$\alpha_p$ is the number of times an identical scaled filter is connected, or the number of connected scaled low-pass filters formed by scaling by p+1 (exponential value).

$\beta_q$ is the number of times an identical scaled filter is connected, or the number of connected scaled high-pass filters formed by scaling by q+1 (exponential value).

$X_0(z)$ is a highest-order filter $L_P(z)=L_0(z^{P+1})$ or $H_Q(z)=H_0(z^{Q+1})$ that has a target bandwidth (frequency width up to the attenuation of −3 dB, for example). The highest degrees p and q are indicated as P and Q.

The relationship between the target bandwidth $f_p$ and the bandwidth $f_0$ of the mother filter $L_0$ or $H_0$ is expressed by the following equation.

$$f_p = f_0/(p+1)$$

Advantages of the cascade connection include the reduction of the bandwidth in the passband and the attenuation of an unnecessary-signal band in the stopband. Making use of these advantages, the embodiment configures a filter with a reduced number of taps.

4. Filter Configuration Method

An example filter configuration method will be described next.

Figure 15:
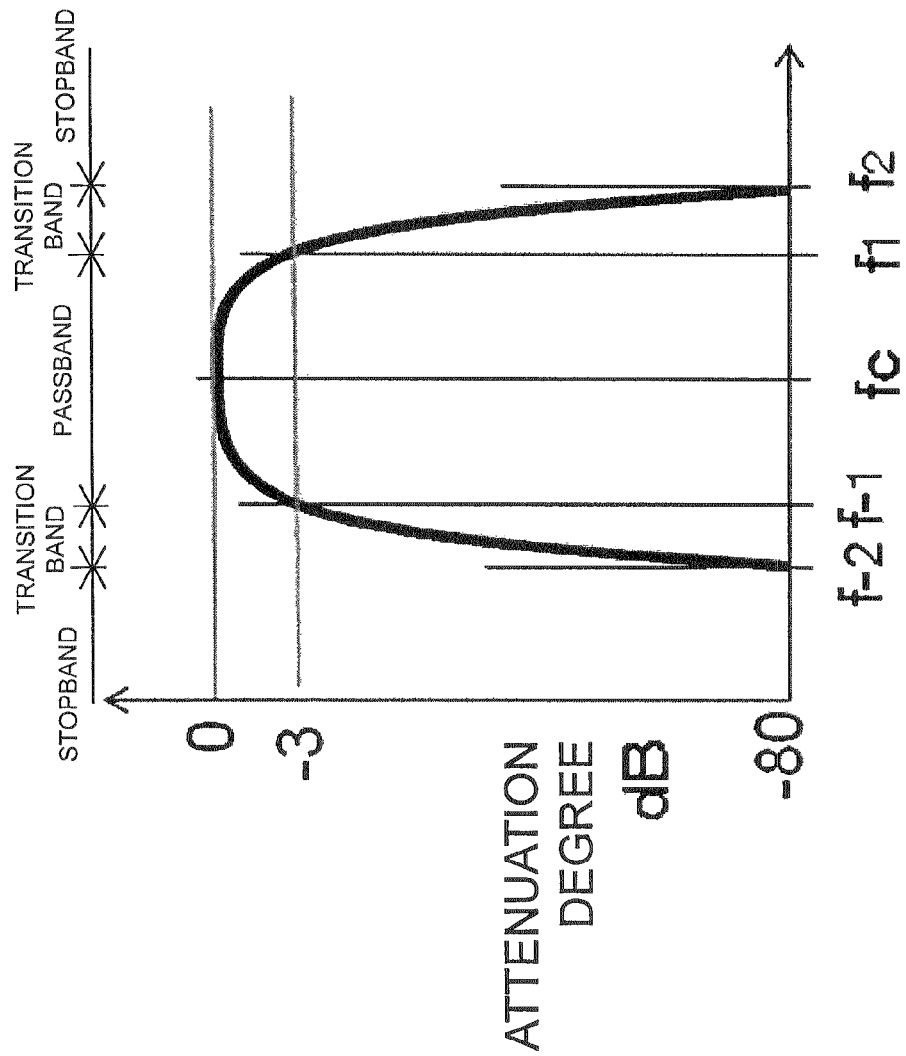
FIG. 15 is an illustration of a band-pass filter in the embodiment.

FIG. 15 is an illustration of a band-pass filter of the embodiment. The figure shows the characteristics of the filter to be implemented as a design target.

The requirements of the filter to be implemented include the following items. The corresponding symbols are shown in FIG. 15.

(1) Sampling frequency fs (2) Center frequency fc (3) Cutoff frequencies (frequencies at which the attenuation is 3 dB) $f_1$, $f_{-1}$ (4) Passband frequency width (width of −3 dB band) Δfb (5) Stopband frequencies $f_2$, $f_{-2}$ (6) Stopband attenuation Ad (dB)

In a signal pass filter, the sampling frequency fs is the repetition frequency of the signal input to the filter, and the center frequency fc is the frequency at the center of the filter, extracted from the frequency components included in the signal. Generally, fc/fs<0.5, according to the Nyquist theorem. The cutoff frequency $f_1$ is the highest frequency at which the signal passes. The symmetrical frequency $f_{-1}$ about the center frequency fc is the lowest frequency at which the signal passes. In the example described here, the attenuation of the passing signal at the cutoff frequencies $f_1$ and $f_{-1}$ is −3 dB, in comparison with the original signal. An appropriate value other than −3 dB can be specified as the reference value. The attenuation A is defined with the magnitude X of the input signal and the magnitude Y of the filter output signal at the cutoff frequency, as indicated in the equation given below.

$$A = 20 * \log_{10} \frac{|Y|}{|X|} = -3 \text{ (dB)} \quad \text{[Expression 16]}$$

$$\frac{|Y|}{|X|} = 10^{-3/20} \cong 0.708 \cong \frac{1}{\sqrt{2}}$$

The input signal is attenuated to about 70.8% (1/√2) at the cutoff frequencies $f_1$ and $f_{-1}$, and the result is output. This means that the amplitude energy of the signal is attenuated to a half.

The signal passband is the range between the cutoff frequencies $f_1$ and $f_{-1}$, and the frequency width Δfb(m) thereof is given by the following equation.

$$\Delta fb(m) = f_1 - f_{-1} = (f_1 - fc)*2$$

where Δfb(m) is the passband of the filter formed by scaling by m+1.

The stopband frequencies $f_2$ and $f_{-2}$ indicate that the frequency components above $f_2$ or below $f_{-2}$ of the input signal are cut off. With the corresponding attenuation degree Ad (such as −80 dB) at the stopband frequencies, the transition band attenuation characteristics from the attenuation level (such as −3 dB) at the cutoff frequencies $f_1$ and $f_{-1}$ to the attenuation degree Ad will be given. An appropriate value other than −80 dB can be specified as the reference value. Ideally speaking, the cutoff frequency should be equal to the stopband frequency. Since that is difficult to realize in actual filters, a transition band is provided. When the attenuation degree Ad in the stopband is −80 dB, the ratio between the input signal X and the filter output signal in magnitude is 0.01% as given below.

$$Ad = 20*\log_{10}\frac{|Y|}{|X|} = -80 \text{ (dB)} \quad \text{[Expression 17]}$$

$$\frac{|Y|}{|X|} = 10^{-80/20} \cong 1/10000$$

Based on the preconditions described above, the filter configuration in this embodiment will be described next.

Figure 16:
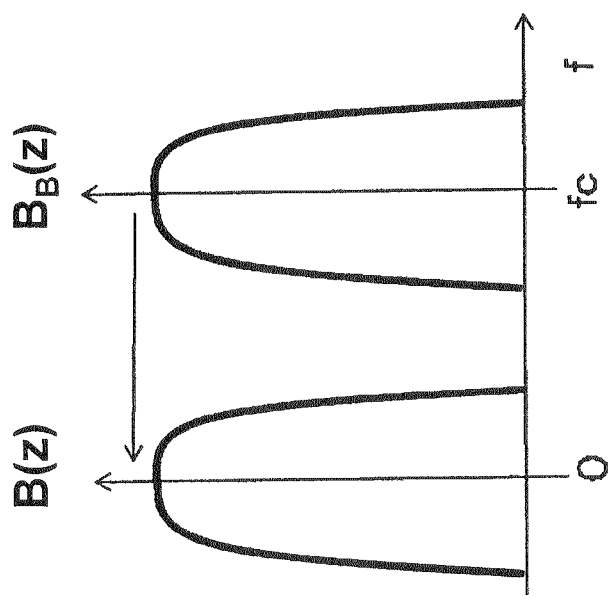
FIG. 16 is an illustration of a frequency shift of the band-pass filter in the embodiment.

FIG. 16 is an illustration of a frequency shift of a band-pass filter in the embodiment.

To simplify the design, a filter B(z) obtained by shifting a band-pass filter $B_B(z)$ with the center frequency fc ($2\pi fc=\omega c$) to the point of frequency zero will be considered, as shown in FIG. 16.

$$B_B(\omega)=B(\omega-\omega_c)+B(\omega+\omega_c) \quad \text{[Expression 18]}$$

here, $$B_B(z)=\Sigma h_B(k)z^{-k}$$

$$B(z)=\Sigma h(k)z^{-k}$$

The frequency shift theorem gives the following.

$$h_B(k) = h(k)e^{j\omega_c k} + h(k)e^{-j\omega_c k} \quad \text{[Expression 19]}$$
$$= h(k)(e^{j\omega_c k} + e^{-j\omega_c k}) = 2h(k)\cos(\omega_c k)$$

The filter $B_B(z)$ is converted by multiplying the coefficient of the filter B(z) by $2\cos(\omega_c k)$.

This means that when the filter B(z) is designed, the requirements should be converted as given below.

Figure 21:
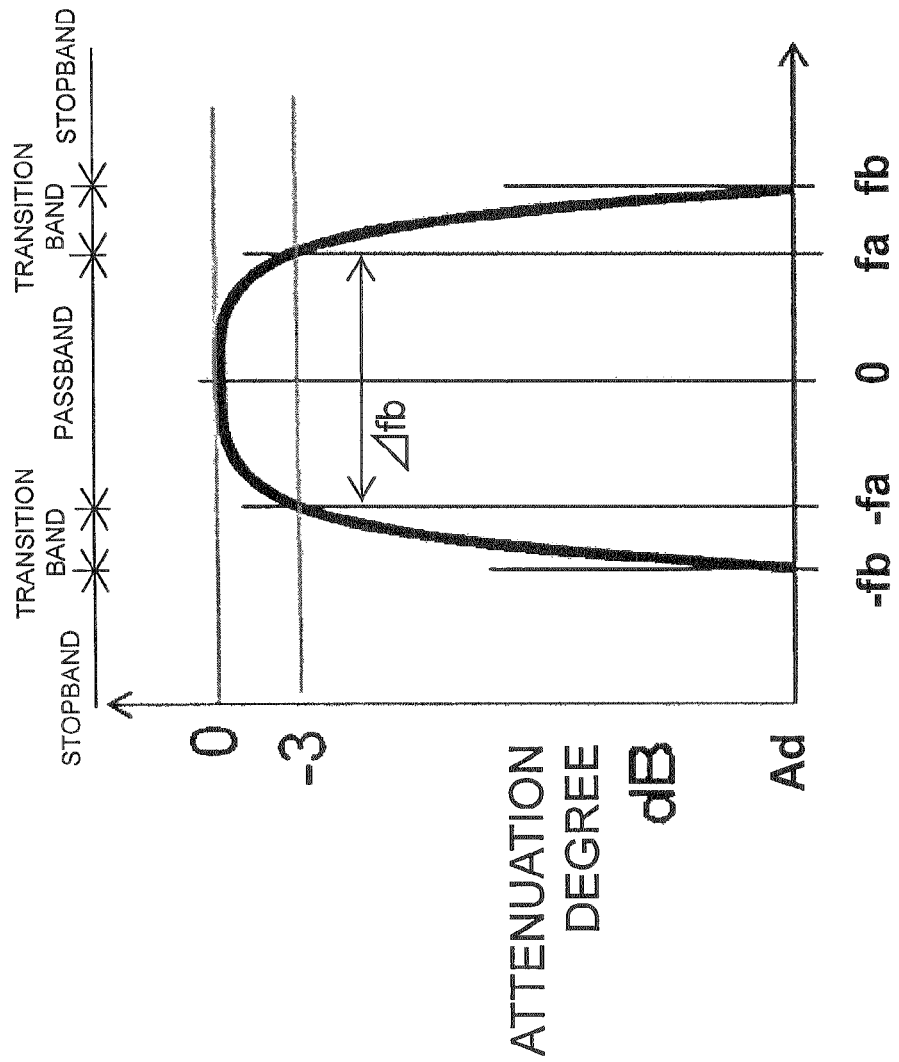
FIG. 21 is an illustration of the band-pass filter of the embodiment.

FIG. 21 is an illustration of the band-pass filter of the embodiment. The figure shows the characteristics of the target filter to be implemented.
(1) Sampling frequency fs
(2) Center frequency 0
(3) Cutoff frequencies (frequencies at which the attenuation is 3 dB, for example) fa=Δfb/2, −Δfb/2=−fa
(4) Passband frequency width (width of −3 dB band, for example) Δfb
(5) Stopband frequencies fb=($f_2-f_{-2}$)/2, −($f_2-f_{-2}$)/2=−fb
(6) Stopband attenuation Ad (dB) (−80 dB, for example)
The cascade connection of filters will be described next.
The general expression is the equation given below.

$$B(z) = B_0(z)\prod_{p=0}^{P} L_p^{\alpha_p}(z) \cdot \prod_{q=0}^{Q} H_q^{\beta_q}(z), \quad \text{[Expression 20]}$$

$$\alpha_p, \beta_q \in N_0$$

$$B_0(z) = L_M(z) \text{ or } H_M(z)$$

$$L_p(z) = L_0(z^{p+1}), \quad H_q(z) = H_0(z^{q+1})$$

$L_p(z)$ is a low-pass filter formed by scaling the basic low-pass filter $L_0(z)$ by p+1.

$H_q(z)$ is a high-pass filter formed by scaling the basic high-pass filter $H_0(z)$ by q+1.

The maximum scaling value M is determined by the frequency width of the passband, and the scaling values P and Q are smaller than M. $\alpha_p$ and $\beta_q$ are identical $L_p(z)$ and $H_q(z)$ raised to some power and indicate cascade connections of $\alpha_p$ and $\beta_q$ filters.

A filter $B_0(z)$ of low-pass filter type is $L_M(z)$, and a filter $B_0(z)$ of high-pass filter type is $H_M(z)$.

Figure 17:
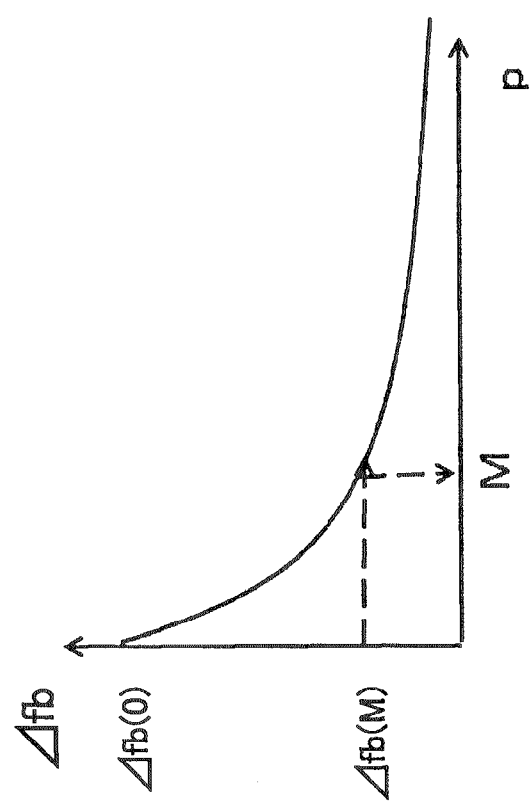
FIG. 17 is an illustration of the relationship between a passband frequency width and scaling factor in this embodiment.

FIG. 17 is an illustration of the relationship between the passband frequency width and scaling factor in this embodiment.

The maximum scaling value M is determined by a required passband frequency width Δfb. The passband width Δfb narrows with an increase in scaling value, as clearly indicated in FIG. 13, and the relationship between Δfb and the scaling value p (or q) is as shown in FIG. 17. The attenuation degree is the ratio of the output Y(m) to the input x(m), or Y(m)/x (m)=Lp(z). The attenuation degree is calculated in decibels (dB) as follows. The Δfb-p relationship satisfies the following.

$$Y(m) = \sum_{k=0}^{p} C(k)x(m-k) = \sum_{k=0}^{p} C(k)x(m)z^{-k} \quad \text{[Expression 21]}$$
$$= L_p(z)x(m)$$

$$A = 20\log_{10}\left|\frac{Y(m)}{x(m)}\right| = 20\log_{10}|L_p(\Delta f_b)| = -3 \text{ [dB]}$$

The relationship between the passband width $\Delta f_{b0}$ ($=\Delta f_{b0}(0)$) of the basic low-pass filter $L_0(z)$ and the passband width $\Delta f_b(p)$ of a low-pass filter formed by scaling by p+1 can be expressed by the following equations.

$$p = \frac{\Delta f_{b0}}{\Delta f_b(p)} - 1 \quad \text{[Expression 22]}$$

$$\Delta f_{b0} = \Delta f_b(0)$$

In this embodiment, a low-pass filter $L_M(z)$ or a high-pass filter $H_M(z)$, where p, q=M, is used as an initial value, for example. Then, p or q is selected in descending order, for example; an optimum combination of p, q, $\alpha_p$, and $\beta_q$ is selected; and B(z) is designed.

Lp(z) or Hp(z) is selected in accordance with whether the attenuation degree at the stopband frequency fb is equal to or smaller than the required value Ad (such as −80 dB). In addition, a filter with the attenuation degree required at the cutoff frequency fa much lower than the value (−3 dB, for example) will not be selected.

The filter $B_B(z)$ to be selected according to the criteria given above is expressed as follows.

$$B_B(z) = B_0(z)\prod_{p=0}^{P} L_{pB}^{\alpha_p}(z) \cdot \prod_{q=0}^{Q} H_{qB}^{B_q}(z) = \sum_{k=1}^{N} h_B(k)z^{-k} \quad \text{[Expression 23]}$$

$$h_b(k) = 2h(k)\cos(\omega_c k)$$

$$B(z) = \sum_{k=1}^{N} h(k)z^{-k}$$

By multiplying the coefficients of the filters $L_p(z)$ and $H_q(z)$ by $2\cos(\omega_c k)$, $L_{pB}(z)$ and $H_{qB}(z)$, which form $B_B(z)$, are obtained.

Figure 19:
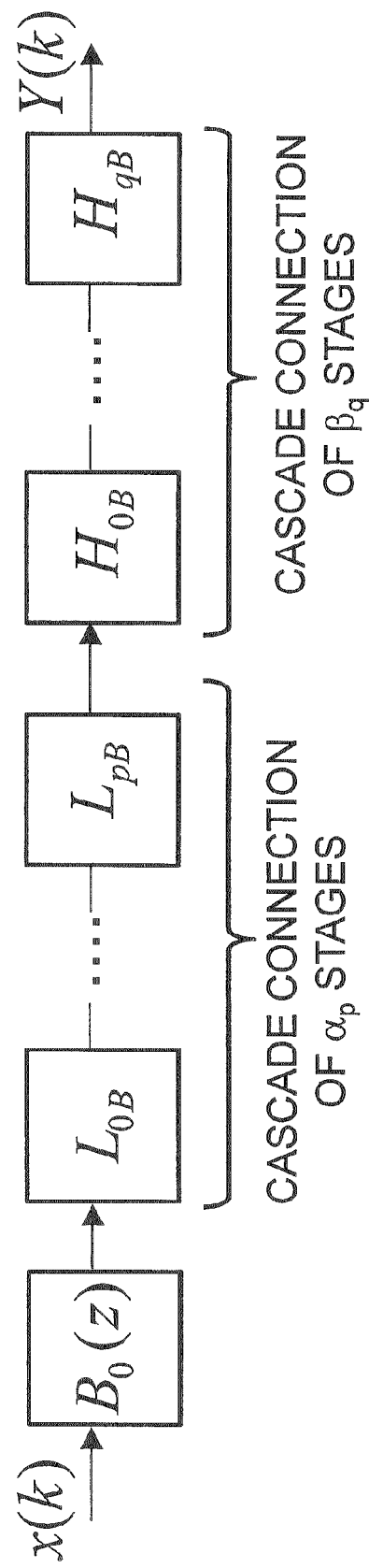
FIG. 19 is a view showing an example configuration of the band-pass filter according to the embodiment.

FIG. 19 is a view showing an example configuration of the band-pass filter according to the embodiment.

The band-pass filter is designed in the method described above in accordance with the configuration shown in the figure.

The filter includes a filter $B_0(z)$ having the maximum scaling value, a filter containing low-pass filters $L_{OB}$ to $L_{p^B}$ formed by scaling by 0B to $p_B$, respectively, connected in $\alpha_p$ stages in cascade, and a filter containing high-pass filters $H_{OB}$ to $H_{qB}$ formed by scaling by 0B to $q_B$, respectively, connected in $\beta$q stages.

Figure 20:
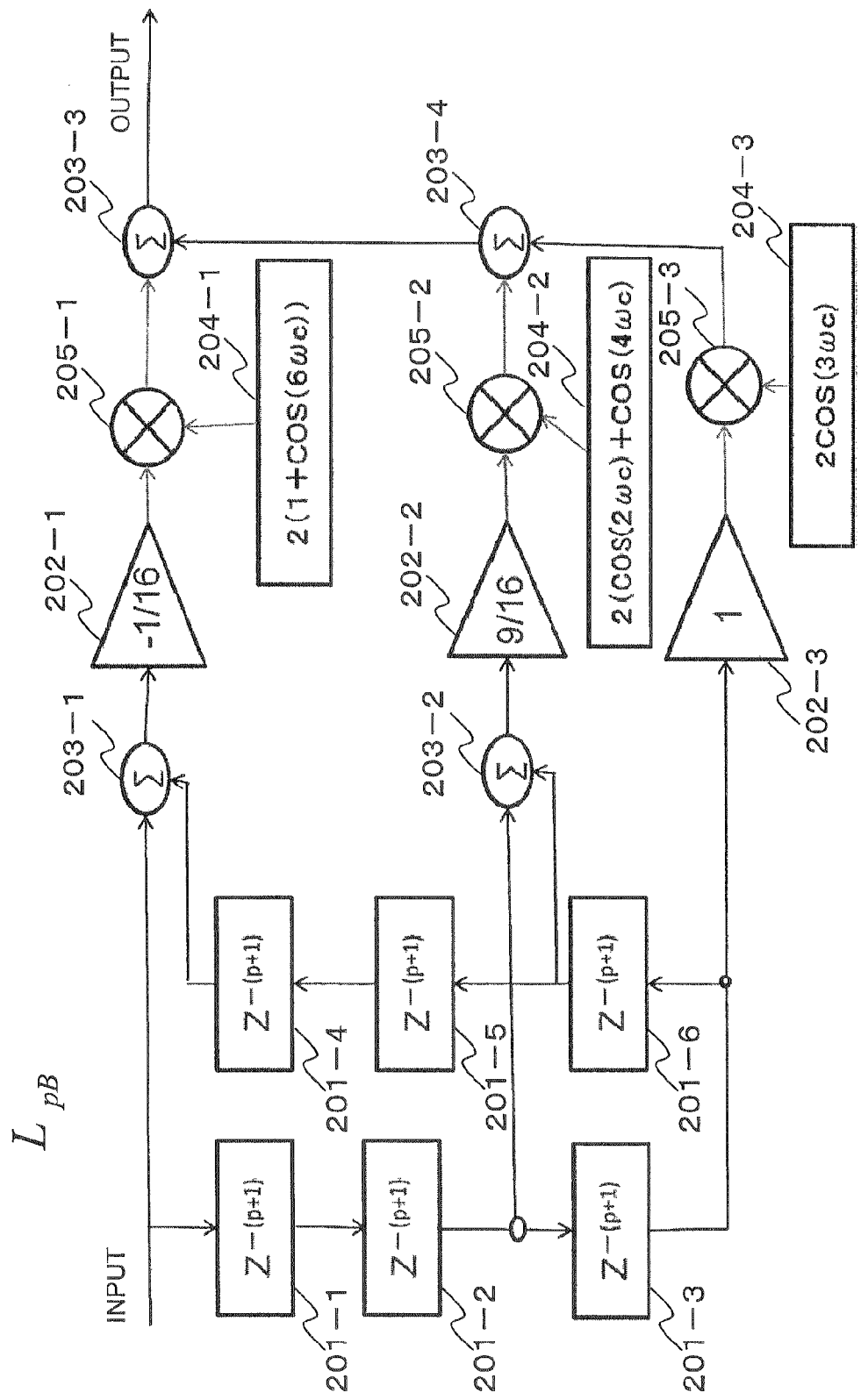
FIG. 20 is a structural view of a scaling filter module of the band-pass filter in the embodiment.

FIG. 20 is a structural view of a low-pass filter $L_{pB}(z)$ formed by scaling by p+1.

The low-pass filter includes delay elements 201-1, 201-2, 201-3, 201-4, 201-5, and 201-6, which cause a delay of p+1 samples, multipliers 202-1, 202-2, and 202-3, and adders 203-1, 203-2, and 203-3, and multipliers 205-1, 205-2, and 205-3. The filter coefficients of the multipliers 202-1, 202-2, and 202-3 are −1/16, 9/16, and 1, respectively. The coefficients of the multipliers 205-1, 205-2, 205-3 are $2(1+\cos(6\omega_c))$, $2(\cos(2\omega_c)+\cos(4\omega_c))$, and $2\cos(3\omega_c)$, respectively. The multiplier 202-3 can be omitted because the coefficient is 1. Pairs of multipliers 202-1 and 205-1, multipliers 202-2 and 205-2, multipliers 203-3 and 205-3 can be configured as integrated multipliers.

Figure 26:
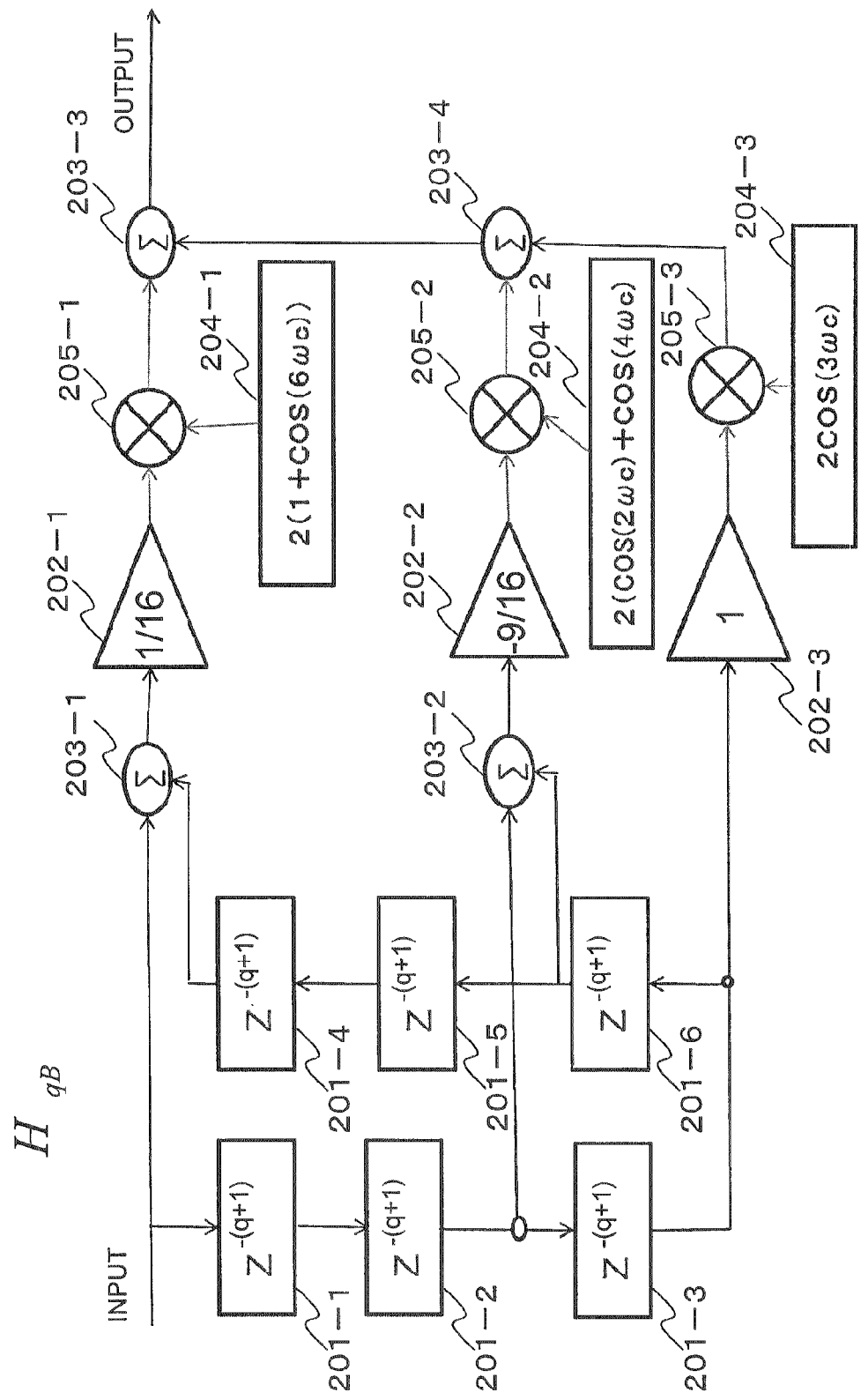
FIG. 26 is a structural view of a high-pass filter $H_{qB}(z)$ formed by scaling by p+1.

FIG. 26 is a structural view of a high-pass filter $H_{qB}(z)$ formed by scaling by q+1.

The high-pass filter includes delay elements 201-1, 201-2, 201-3, 201-4, 201-5, and 201-6, which cause a delay of q+1 samples, multipliers 202-1, 202-2, and 202-3, adders 203-1, 203-2, and 203-3, and multipliers 205-1, 205-2, and 205-3. The filter coefficients of the multipliers 202-1, 202-2, and 202-3 are 1/16, −9/16, and 1, respectively. The coefficients of the multipliers 205-1, 205-2, and 205-3 are $2(1+\cos(6\omega_c))$, $2(\cos(2\omega_c)+\cos(4\omega_c))$, and $2\cos(3\omega_c)$, respectively. The multiplier 202-3 can be omitted because the coefficient is 1. Pairs of multipliers 202-1 and 205-1, multipliers 202-2 and 205-2, multipliers 203-3 and 205-3 can be configured as integrated multipliers.

5. Filter Circuit Configuration

Other filter circuit configurations will be described next.

Figure 22:
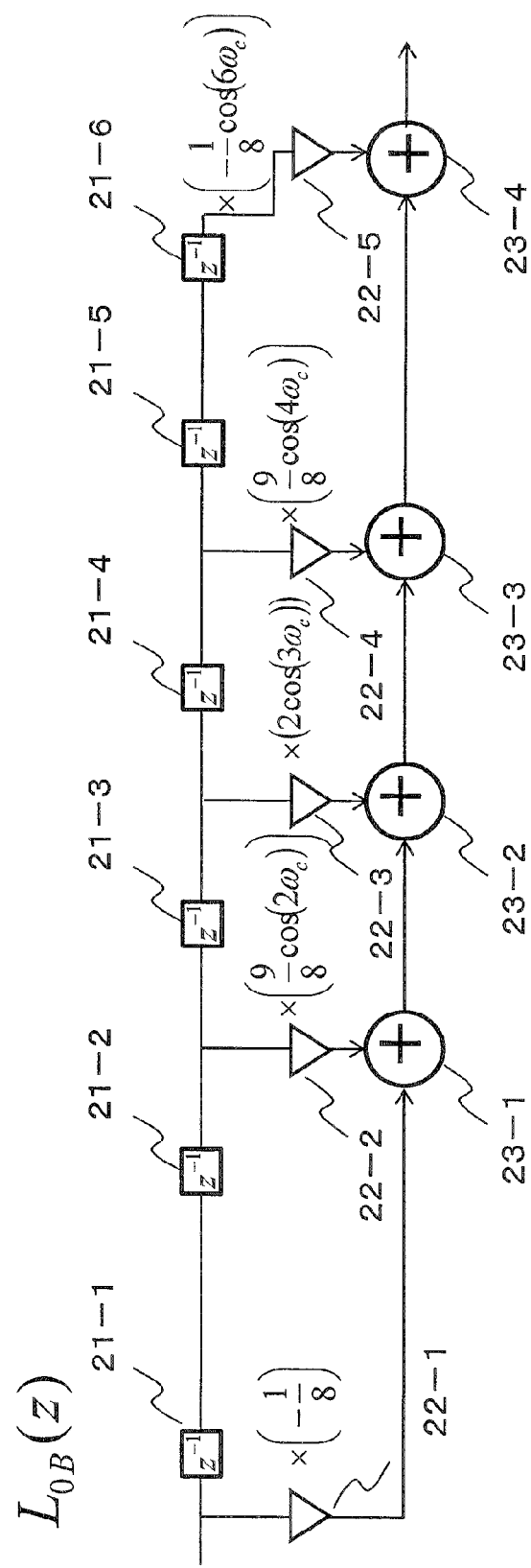
FIG. 22 is a structural view of a basic low-pass filter $L_{0B}(z)$.

FIG. 22 is a structural view of the basic low-pass filter $L_{OB}(z)$.

The basic low-pass filter $L_{OB}(z)$ expressed by the equation given above has the shown circuit configuration.

The basic low-pass filter includes delay elements 21-1, 21-2, 21-3, 21-4, 21-5, and 21-6, which cause a delay of a single sample, multipliers 22-1, 22-2, 22-3, 22-4, and 22-5, and adders 23-1, 23-2, 23-3, and 23-4. The filter coefficients of the multipliers 22-1, 22-2, 22-3, 22-4, and 22-5 are −1/8, $9\cos(2\omega_c)/8$, $2\cos(3\omega_c)$, $9\cos(4\omega_c)/8$, and $-\cos(6\omega_c)/8$, respectively.

Figure 23:
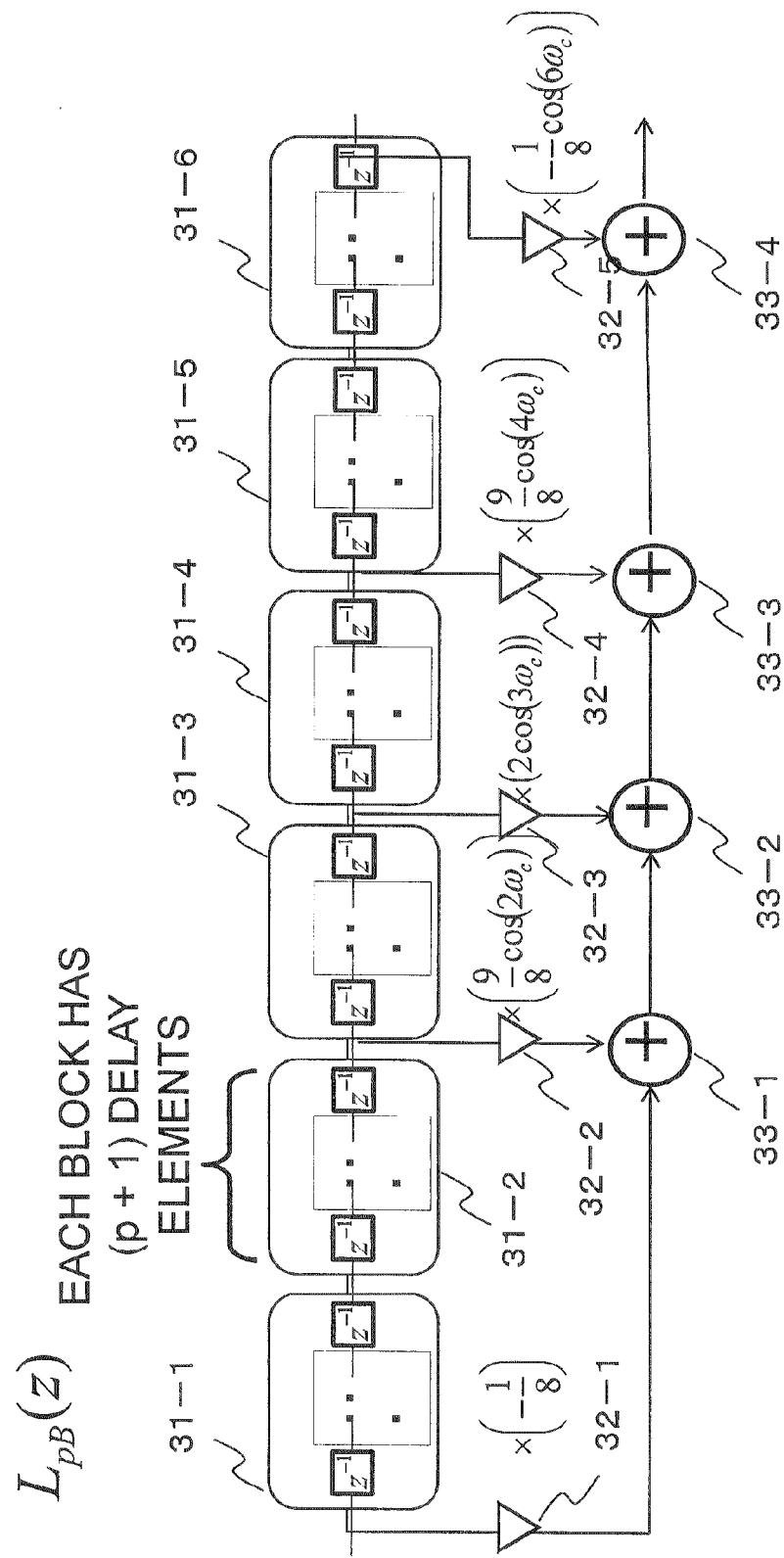
FIG. 23 is a structural view of a low-pass filter $L_{pB}(z)$ formed by scaling by p+1.

FIG. 23 is a structural view of the low-pass filter $L_{pB}(z)$ formed by scaling by p+1.

As shown in the figure, the low-pass filter $L_{pB}(z)$ formed by scaling by p+1 has the same structure as $L_{OB}$, but $Z^{-1}$ is replaced with $Z^{-(p+1)}$.

The low-pass filter formed by scaling by p+1 includes blocks 31-1, 31-2, 31-3, 31-4, 31-5, and 31-6 having p+1 delay elements, multipliers 32-1, 32-2, 32-3, 32-4, and 32-5, and adders 33-1, 33-2, 33-3, and 33-4. The filter coefficients of the multipliers 32-1, 32-2, 32-3, 32-4, and 32-5 are −1/8, $9\cos(2\omega_c)/8$, $2\cos(3\omega_c)$, $9\cos(4\omega_c)/8$, and $-\cos(6\omega_c)/8$, respectively.

In the figure, the delay elements 31-1 to 31-6 each have p+1 delay elements. Each delay element block may have any number of delay elements, if they cause a delay of p+1 samples.

Figure 24:
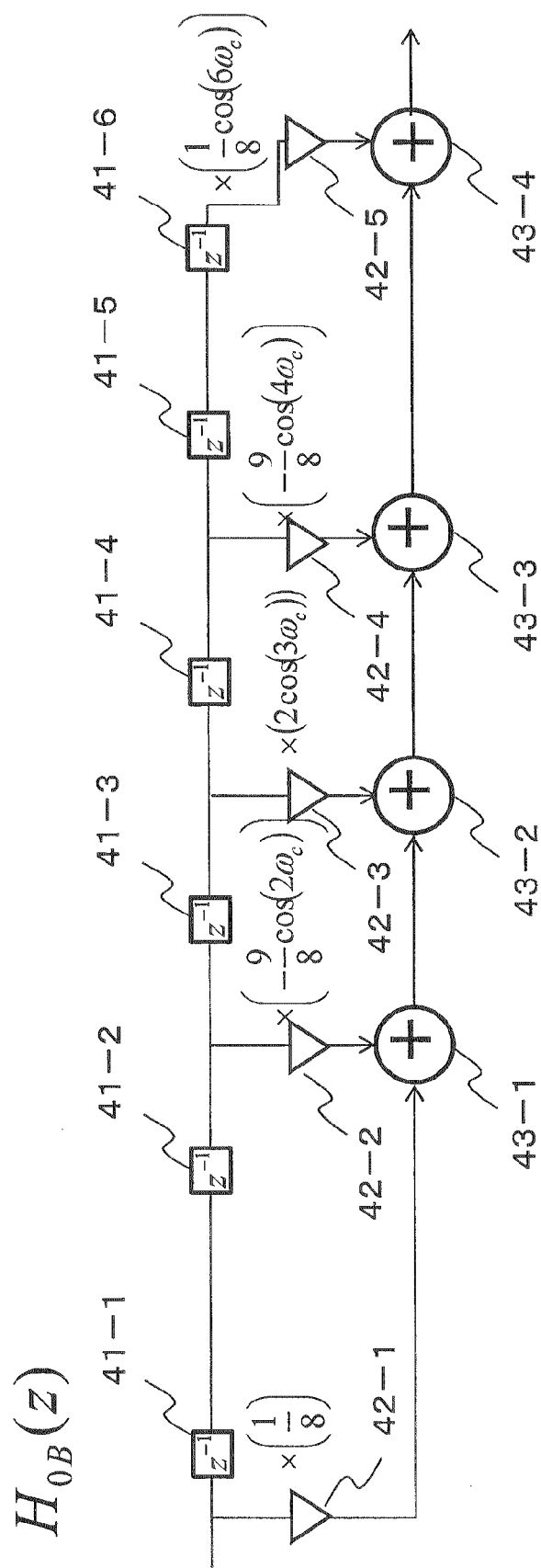
FIG. 24 is a structural view of a basic high-pass filter $H_{0B}(z)$.

FIG. 24 is a structural view of the basic high-pass filter $H_{OB}(z)$.

The basic high-pass filter $H_{OB}(z)$ has the shown circuit configuration.

The basic high-pass filter has delay elements 41-1, 41-2, 41-3, 41-4, 41-5, and 41-6 that cause a delay of a single sample, multipliers 42-1, 42-2, 42-3, 42-4, and 42-5, and adders 43-1, 43-2, 43-3, and 43-4. The filter coefficients of the multipliers 42-1, 42-2, 42-3, 42-4, and 42-5 are 1/8, $-9\cos(2\omega_c)/8$, $2\cos(3\omega_c)$, $-9\cos(4\omega_c)/8$, and $\cos(6\omega_c)/8$, respectively.

Figure 25:
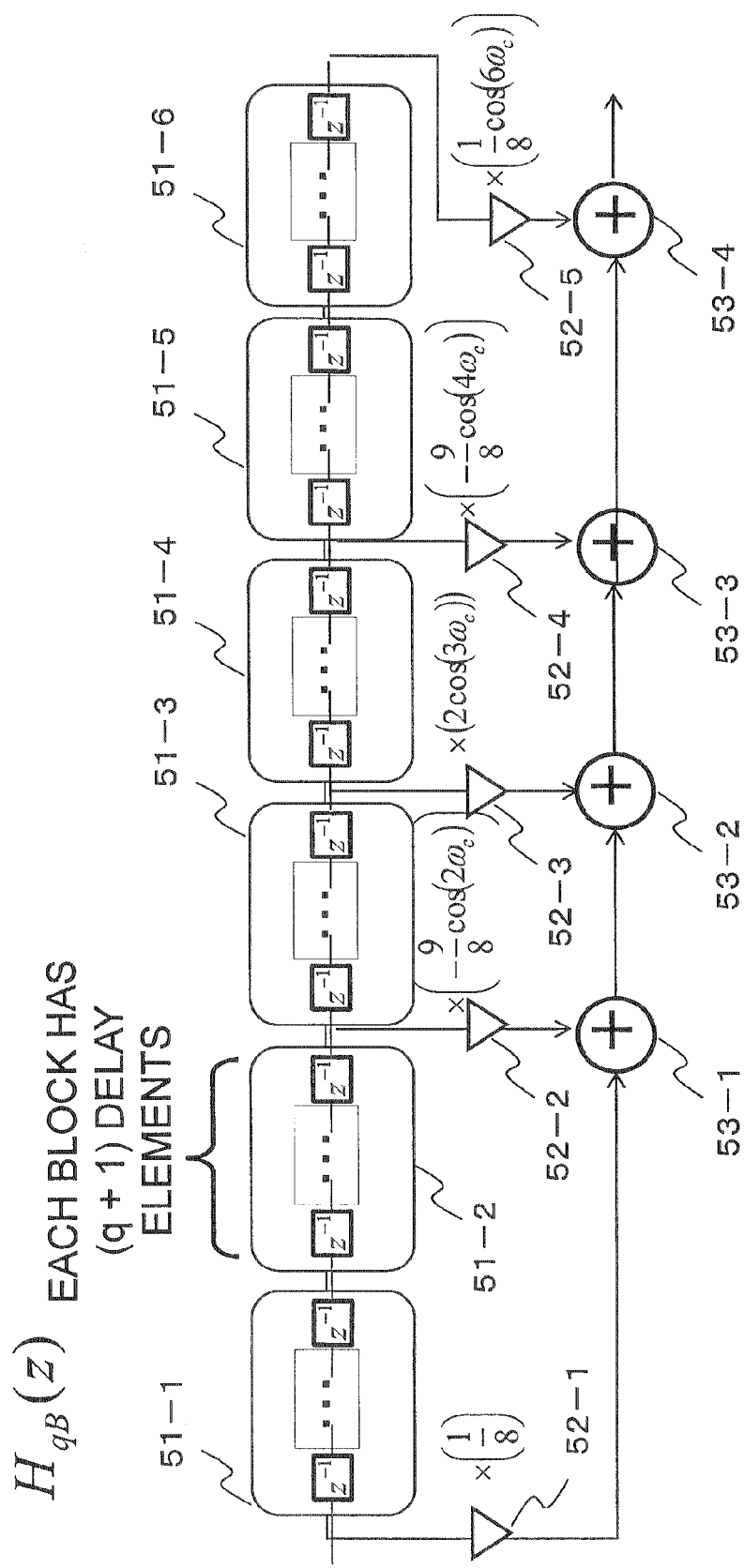
FIG. 25 is a structural view of a high-pass filter $H_{pB}(z)$ formed by scaling by p+1.

FIG. 25 is a structural view of the high-pass filter $H_{qB}(z)$ formed by scaling by q+1.

The high-pass filter $H_{qB}(z)$ formed by scaling by q+1 has the same structure as the filter $H_0$ as shown in the figure, but $Z^{-1}$ is replaced with $Z^{-(q+1)}$.

The high-pass filter formed by scaling by q+1 includes blocks 51-1, 51-2, 51-3, 51-4, 51-5, and 51-6 that have q+1 delay elements, multipliers 52-1, 52-2, 52-3, 52-4, and 52-5, and adders 53-1, 53-2, 53-3, and 53-4. The filter coefficients of the multipliers 52-1, 52-2, 52-3, 52-4, and 52-5 are 1/8, $-9\cos(2\omega_c)/8$, $2\cos(3\omega_c)$, $-9\cos(4\omega_c)/8$, and $\cos(6\omega_c)/8$, respectively.

In the figure, the delay elements 51-1 to 51-6 each have q+1 delay elements. Each delay element block may have any number of delay elements, if they cause a delay of q+1 samples.

6. Hardware

Figure 32:
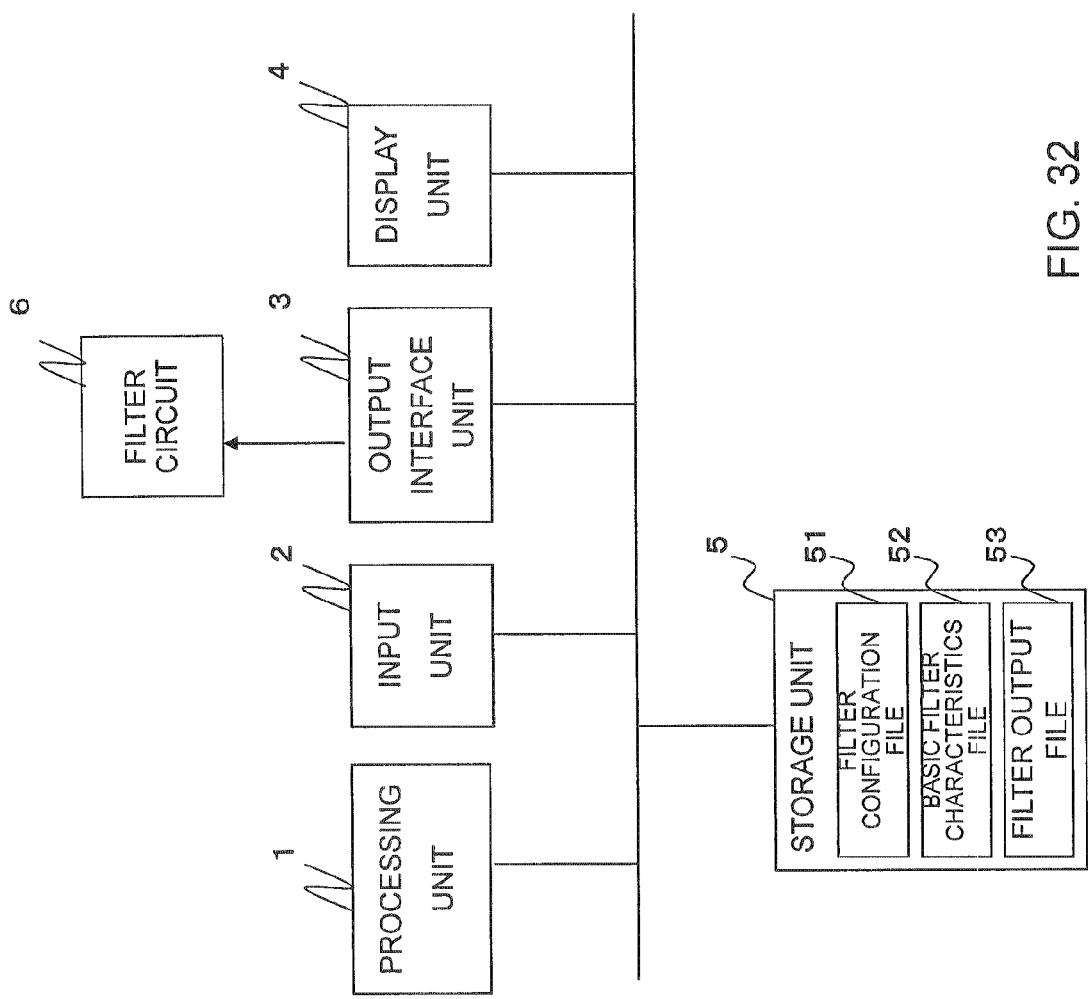
FIG. 32 is a structural view of the hardware of a design system according to the embodiment.

FIG. 32 is a structural view of the hardware of a design system according to the embodiment.

The design system includes a processing unit 1, which is a central processing unit (CPU), an input unit 2, an output interface unit 3, a display unit 4, a storage unit 5, and a filter circuit 6. The processing unit 1, input unit 2, output interface unit 3, display unit 4, and storage unit 5 are connected by a star, bus, or another connection means.

The processing unit 1 accesses the storage unit 5 and executes filter design processing.

The storage unit 5 includes a filter configuration file 51 that stores design specifications and requirements (such as conditions (range, value, ratio, etc) of the passband and stopband, upper limits of the numbers $\alpha_p$ and $\beta_q$ of filters connected in cascade), a basic filter characteristics file 52 that stores the characteristics of the basic low-pass filter, the low-pass filters $L_0$ to $L_p$ formed by scaling the basic low-pass filter, the low-pass filter $L_{pB}$ formed by multiplying the filter coefficient of the filter $L_p$ by $2\cos(\omega_c k)$, the basic high-pass filter, the high-pass filters $H_0$ to $H_q$ formed by scaling the basic high-pass filter, and the high-pass filter $H_{qB}$ formed by multiplying the filter coefficients of filter $H_q$ by $2\cos(\omega_c k)$, and a filter output file 53 that stores data and parameters (such as the shift amount B, maximum scaling value M, filter coefficients p, q, $\alpha_p$, $\beta_q$ of multipliers) for determining a designed filter configuration and intermediate results, final results, and so on by the processing unit 1, such as designed filter characteristics. The processing unit 1 can output these data items (for example, data and parameters for determining the filter configuration, such as the filter coefficients of multipliers) through the output interface unit 3 to the filter circuit 6. The filter circuit 6 is provided by software or hardware and implements a filter having the specified characteristics in accordance with the data items set up through the output interface unit 3 by the processing unit 1.

7. Design Flowchart

Figure 18:
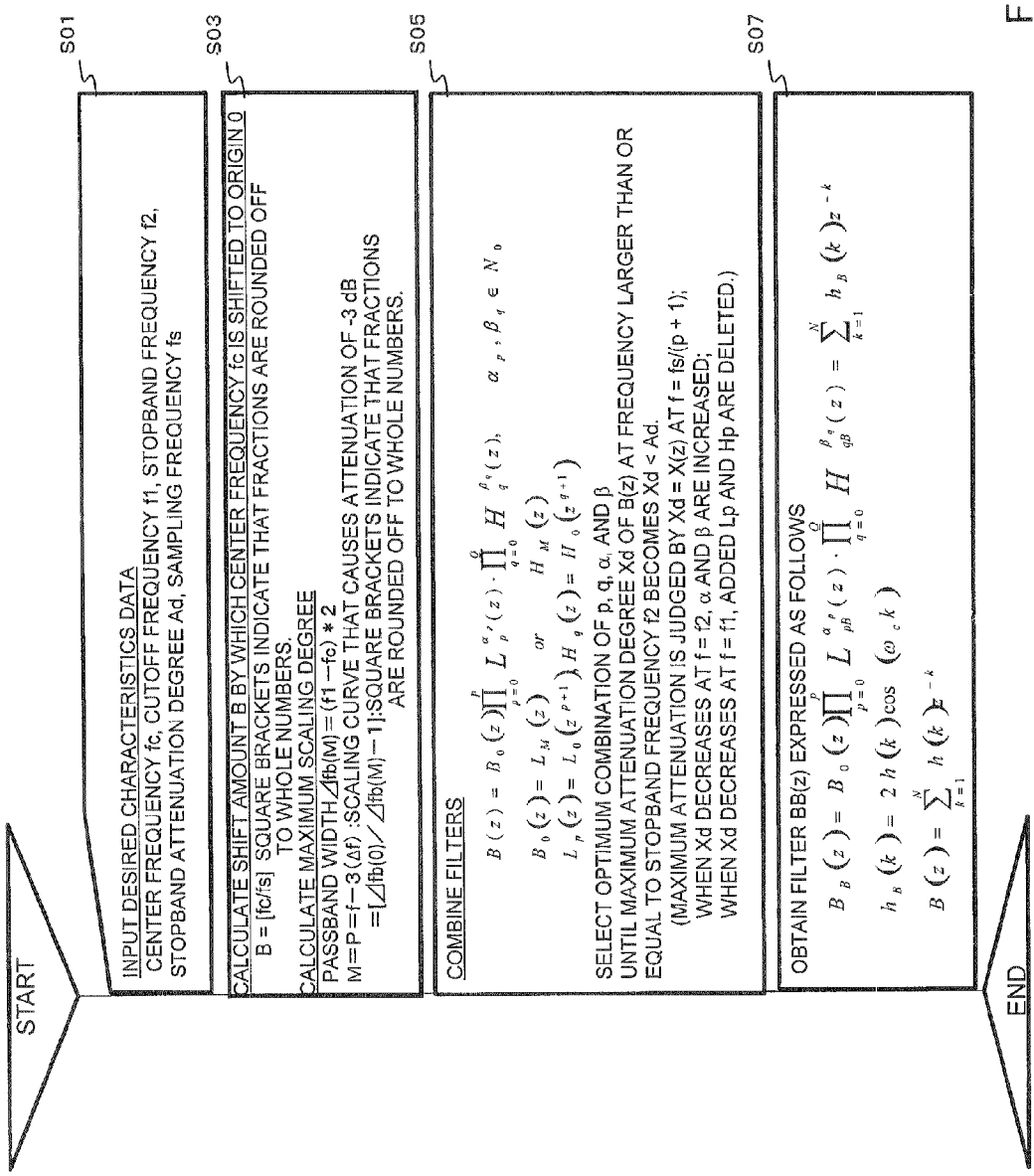
FIG. 18 is a flowchart illustrating a processing procedure in the embodiment.

FIG. 18 is a flowchart illustrating a processing procedure in the embodiment.

The design system configures a filter through steps S01 to S07 described below.

(1) Step S01

The processing unit 1 specifies beforehand desired characteristics data to be given as design specifications and requirements, including the center frequency fc, cutoff frequency f1, stopband frequency f2, passband attenuation degree A, stopband attenuation degree Ad, and sampling frequency fs, for example, by storing them in the storage unit 5 (filter configuration file 51) through operations from the input unit 2 or by reading the values stored in the storage unit 5 (filter configuration file 51) beforehand.

(2) Step S03

The processing unit 1 reads the values of characteristics data specified in step S01, from the storage unit 5 (filter configuration file 51), and calculates the shift amount B, which shifts the center frequency fc to the origin O, by the equation given below, in accordance with the input characteristics data.

B=[fc/fs] (The square brackets indicate that fractions are rounded off to the whole numbers.)

The processing unit 1 stores the obtained shift amount B in the storage unit 5 (filter output file 53).

The processing unit 1 also converts the center frequency fc, cutoff frequency f1, and stopband frequency f2 of the input characteristics data to the center frequency 0, cutoff frequency $f_a$, and stopband frequency $f_b$, respectively, in accordance with the shift amount B, and stores the values in the storage unit 5 (filter output file 53).

The processing unit 1 reads the values of the characteristics data specified in step S01, from the storage unit 5 (filter configuration file 51), and calculates the scaling value (scaling factor) M of the highest degree on the basis of the input characteristics data.

To obtain the scaling value M of the highest-degree (maximum scaling value), the processing unit calculates the passband width Δfb(M) of the filter formed by scaling by M+1, as given below, for example.

Passband width Δfb(M)=(f1−fc)*2

Then, the processing unit 1 obtains the maximum scaling value M from the passband width Δfb(M) by referencing a scaling curve stored in advance in the storage unit 5 (basic filter characteristics file 52) or by calculating the equation of a scaling curve.

M=P=f_−3(Δfb(M))=[Δfb(0)/Δfb(M)−1]

f_−3(Δfb(M)): Scaling curve that causes an attenuation of 3 dB
[ ]: The square brackets indicate that fractions are rounded off to the whole numbers.
Δfb(0): Passband width of the basic filter
Δfb(M): Passband width of the filter formed by scaling by M+1

The scaling curve of −3 dB is shown in this example, but any other scaling curve of an appropriate value may be determined in advance with respect to the cutoff frequency or the passband frequency width or may be calculated and specified by the processing unit 1.

The processing unit 1 may allow the maximum scaling value M to be determined beforehand by the input unit 2 or storage unit 5.

The processing unit 1 stores the calculated maximum scaling value M in the storage unit 5 (filter output file 53).

(3) Step S05

The processing unit 1 reads from the storage unit 5 (filter configuration file 51 and filter output file 53) the values specified in step S01 and the maximum scaling value M calculated in step S03. The processing unit 1 also selects from the storage unit 5 an optimum combination of p, q, $\alpha_p$, and $\beta_q$ in accordance with the filter combination as given by the equation below.

[Expression 24]
$$B(z) = B_0(z) \prod_{p=0}^{P} L_p^{\alpha_p}(z) \cdot \prod_{q=0}^{Q} H_q^{\beta_q}(z),$$

$\alpha_p, \beta_q \in N_0$ $B_0(z) = L_M(z)$ or $H_M(z)$ $L_p(z) = L_0(z^{p+1}), \quad H_q(z) = H_0(z^{q+1})$ The processing unit 1 reads from the storage unit 5 (basic filter characteristics file 52) the characteristics of the low-pass filter $L_p$ and high-pass filter $H_q$ determined by p and q, calculates the characteristics of B(z) on the basis of the equation given above, and selects values conforming to the passband and stopband design specifications on a round-robin basis. The processing unit 1 may further select values that minimize the number of multipliers.

The selection of $L_p(z)$ and $H_p(z)$ is made, depending on whether the attenuation degree at the stopband frequency fb is lower than or equal to the required value Ad (for example, −80 dB), and, at the same time, depending on it that a filter with an attenuation degree much lower than the required value (for example, −3 dB) at the cutoff frequency fa will not be selected (for example, a filter below a predetermined permissible level will not be selected). Thus, the processing unit 1 selects an optimum combination of p, q, $\alpha_p$, and $\beta_q$.

The maximum values of $\alpha_p$ and $\beta_q$ can be specified beforehand in the storage unit 5 (filter configuration file 51) or the like, and the processing unit 1 can select an optimum combination of p, q, $\alpha_p$, and $\beta_q$ by selecting $\alpha_p$ and $\beta_q$ in descending order from the stored maximum values and selecting p and q in descending order from the maximum scaling value M.

Here, the processing unit may make the following judgment or processing.

(The maximum attenuation is judged by Xd=X(z) at f=fs/(p+1): When Xd decreases at f=f2, α and β are increased; When Xd decreases at f=f1, added Lp and Hp are deleted.)

In the description given above, the characteristics of filters formed by scaling the basic low-pass filter and basic high-pass filter are stored beforehand in the storage unit 5 (basic filter characteristics file 52). However, the characteristics of just the basic low-pass filter and the basic high-pass filter may be stored in the basic filter characteristics file 52, and the processing unit 1 may obtain the characteristics of a desired scaled filter through scaling based on the stored characteristics as necessary and use those characteristics.

The processing unit 1 stores the obtained p, q, $\alpha_p$, and $\beta_q$ in the storage unit 5 (filter output file 53).

(4) Step 07

The processing unit 1 reads from the storage unit 5 (filter output file 53) the specification data and parameters for configuring the filter, such as p, q, $\alpha_p$, and $\beta_q$, reads further from the storage unit 5 (basic filter characteristics file 52) the characteristics of the filter $L_{0M}$ or filter $H_{0M}$ corresponding to $B_0(z)$, according to the low-pass filter or the high-pass filter, and the characteristics of the filter $L_{pB}$ and filter $H_{qB}$, forms the filter $B_B(z)$ in accordance with the equation given below, and displays on the display unit 4 the filter characteristics and the parameters and data that are used or stores them in the storage unit 5 (filter output file 53), or both displays and stores them.

$$B_B(z) = B_0(z) \prod_{p=0}^{P} L_{pB}^{\alpha_p}(z) \cdot \prod_{q=0}^{Q} H_{qB}^{\beta_q}(z) = \sum_{k=1}^{N} k_B(k) z^{-k}$$ [Expression 25]

$$h_B(k) = 2h(k)\cos(\omega_c k)$$

$$B(z) = \sum_{k=1}^{N} h(k) z^{-k}$$

The processing unit 1 can also read from the storage unit 5 (filter output file 53) the specification data and parameters for configuring the filter, such as p, q, $\alpha_p$, and $\beta_q$, read from the storage unit 5 (basic filter characteristics file 52) the characteristics of the filters $L_{pB}$ and $H_{qB}$, and output the values through the output interface unit 3 to the filter circuit 6. The processing unit 1 may use the filter circuit 6 to form the filter $B_B(z)$ in accordance with the read values. The filter circuit 6 can form the filter $B_B(z)$ with a computer simulation or by software. The filter circuit 6 may be configured by hardware to form the filter $B_B(z)$ in accordance with the values output from the output interface unit 3.

8. Method of Coefficient Quantization Expansion

A quantization expansion method for filter coefficients will be described next.

The quantization expansion method here means a method of implementing the same characteristics as the impulse response characteristics of the filter designed to include the cascade connection configuration, as described above, by a shown filter circuit configuration.

Since $L_p(z) = L_0(z^{P+1})$, an impulse signal is input to the filter designed to include the cascade connection given below to obtain the response.

$$X(z) = X_0(z) \Pi_{p=0}^{P} L_p^{\alpha}(z) \Pi_{q-1}^{Q} H_q^{\beta}(z)$$ [Expression 26]

The impulse response can be calculated by a simulation program such as the well-known MATLAB to obtain the waveform of the impulse response. Alternatively, an expansion of X(z) given above can be derived by a mathematical operation program such as the well-known MATHEMATHICA. The expansion is the impulse response function of X(z).

$$X(z) = X_0(z) \Sigma_{k=0}^{k=K} C_k z^{-k}$$ [Expression 27]

Therefore, the coefficient $C_k$ of the impulse response can be used as filter coefficients when a filter is configured.

Figure 27:
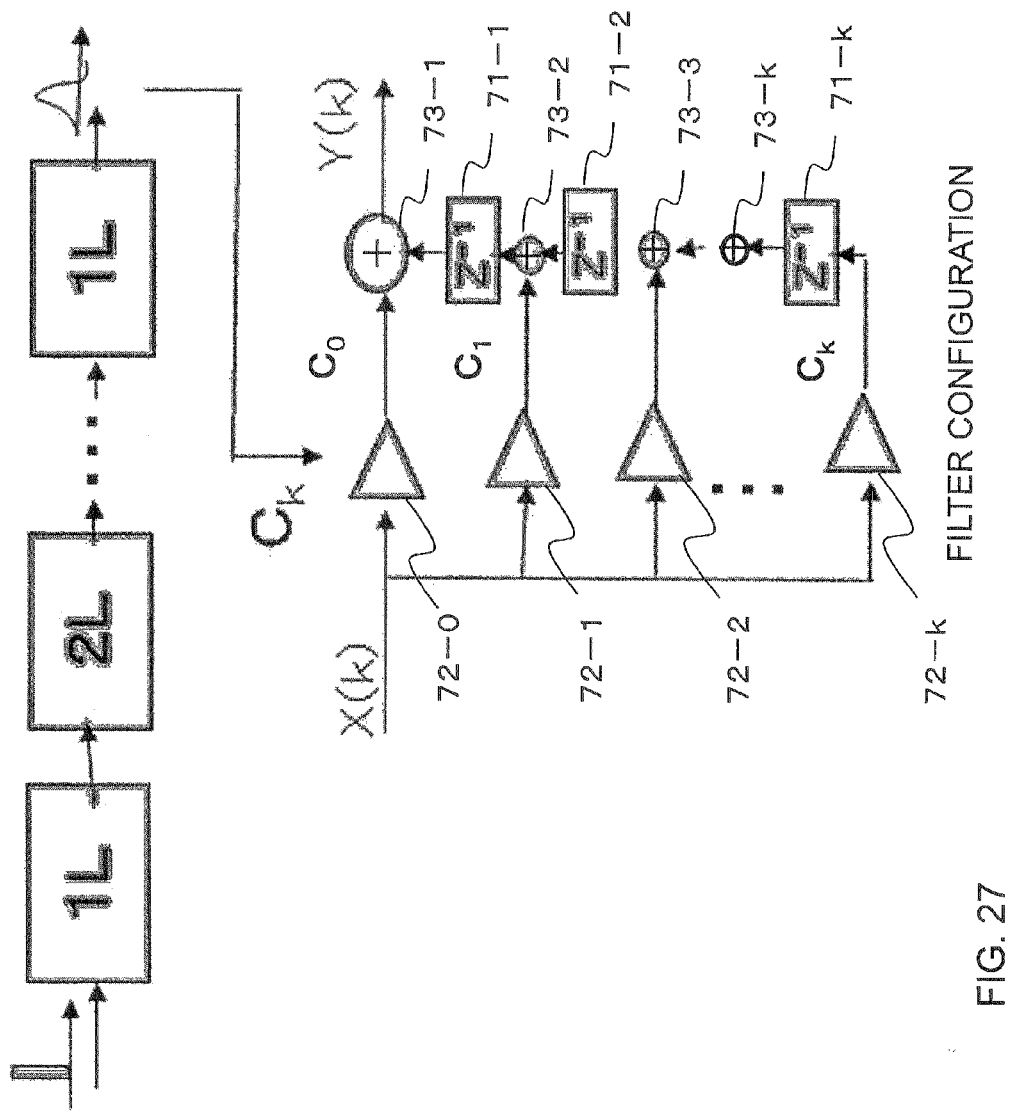
FIG. 27 shows a filter structural view.

FIG. 27 shows a filter structural diagram.

The filter includes multipliers 72-0 to 72-k, delay elements 71-1 to 71-k that cause a delay of a single sample, and adders 73-1 to 73-k.

For example, the processing unit 1 reads data (filter coefficients, p, q, $\alpha_p$, $\beta_q$, etc.) for configuring the filter from the storage unit 5 (filter output file 53), obtains the impulse response by using the filter circuit 6 or the like, and stores the coefficient $C_k$ of the impulse response in the storage unit 5 (filter output file 53).

Since the processing unit 1 reads the filter coefficient from the storage unit 5 and uses the filter circuit 6, the coefficients $C_k$ (k+1 coefficients) can be used as the filter coefficients (tap coefficients) in the shown circuit configuration, and the filter can be configured by using k delay elements $z^{-1}$.

Figure 28:
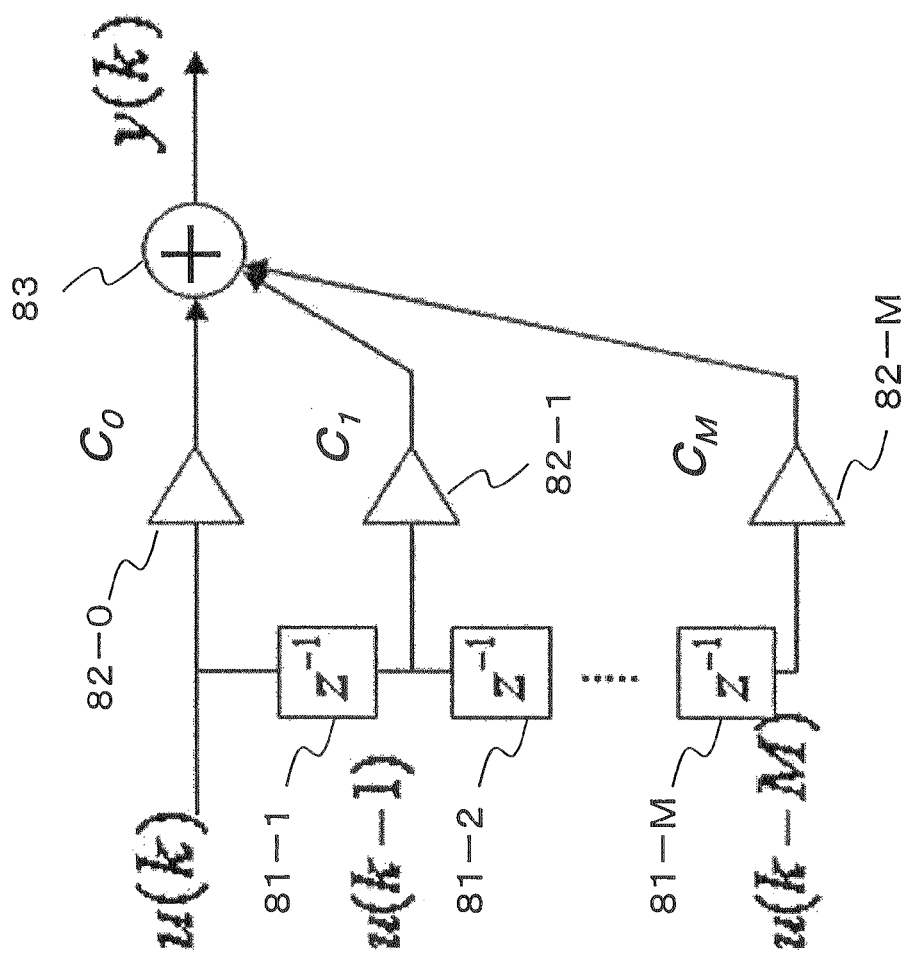
FIG. 28 shows another filter structural view.

FIG. 28 shows another filter structural diagram.

The filter includes multipliers 82-0 to 82-M, delay elements 81-1 to 81-M, and an adder 83.

A filter having characteristics designed in accordance with the filter coefficient $C_k$ obtained as described above can be configured as shown in the figure besides the filter configuration described earlier.

9. Comparison Between this Embodiment and a Conventional Method

The method according to this embodiment will be compared with a conventional method below.

The requirements in the embodiment are as listed below.

Figure 29:
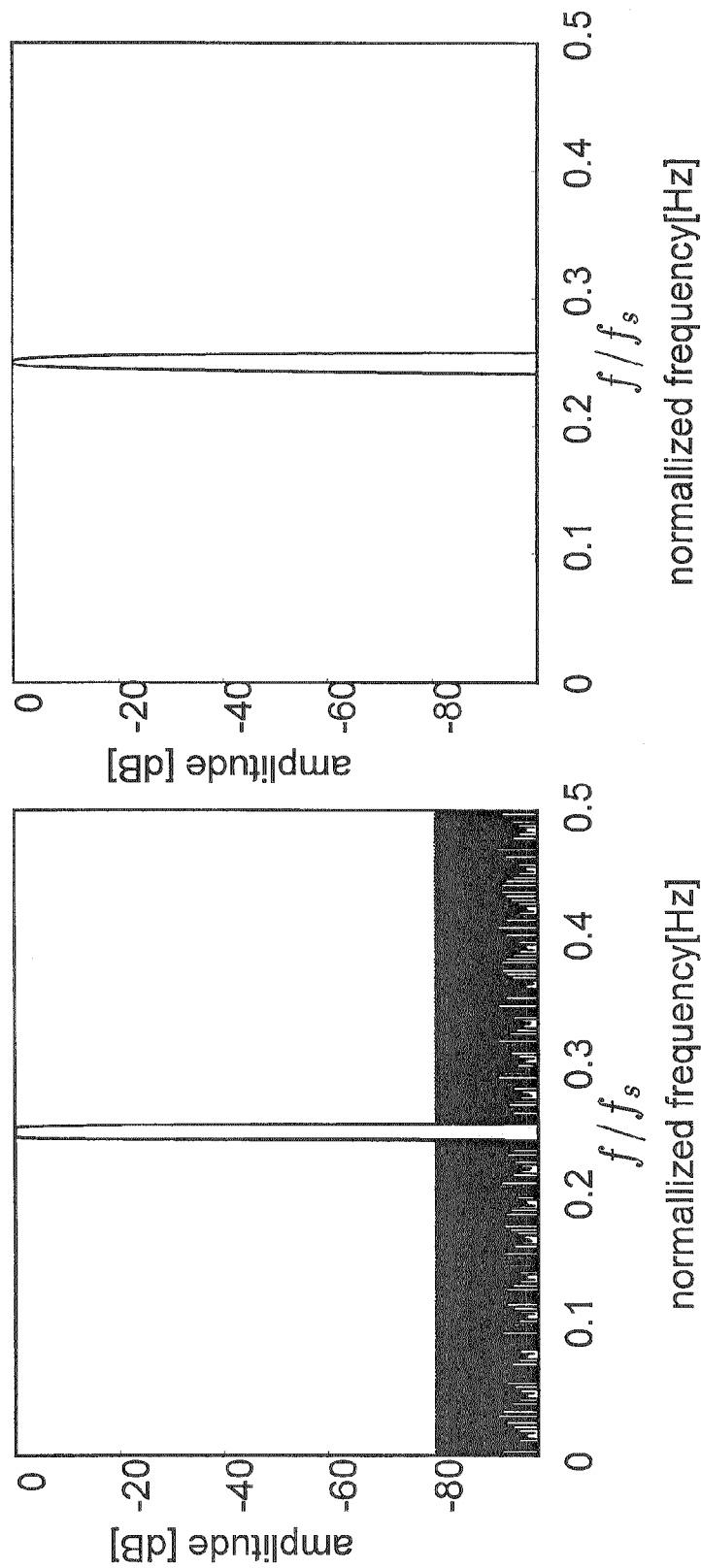
FIG. 29 is a frequency characteristics diagram of a filter designed with theoretical values by each method.

Sampling frequency: 1.8 MHz
Center frequency: 450 kHz
−3 dB bandwidth: 6 kHz
−80 dB bandwidth: 12 kHz
Quantization bit rate: 18 bits
Phase characteristics: Linear phase FIG. 29 is a frequency characteristics diagram of filters designed with theoretical values by different methods.

As the left graph shows, the Remez method satisfies the requirements but generates ripples in the passband and stopband.

The right graph shows that the filter according to the present invention satisfies the specifications and makes a large attenuation in the stopband.

Figure 30:
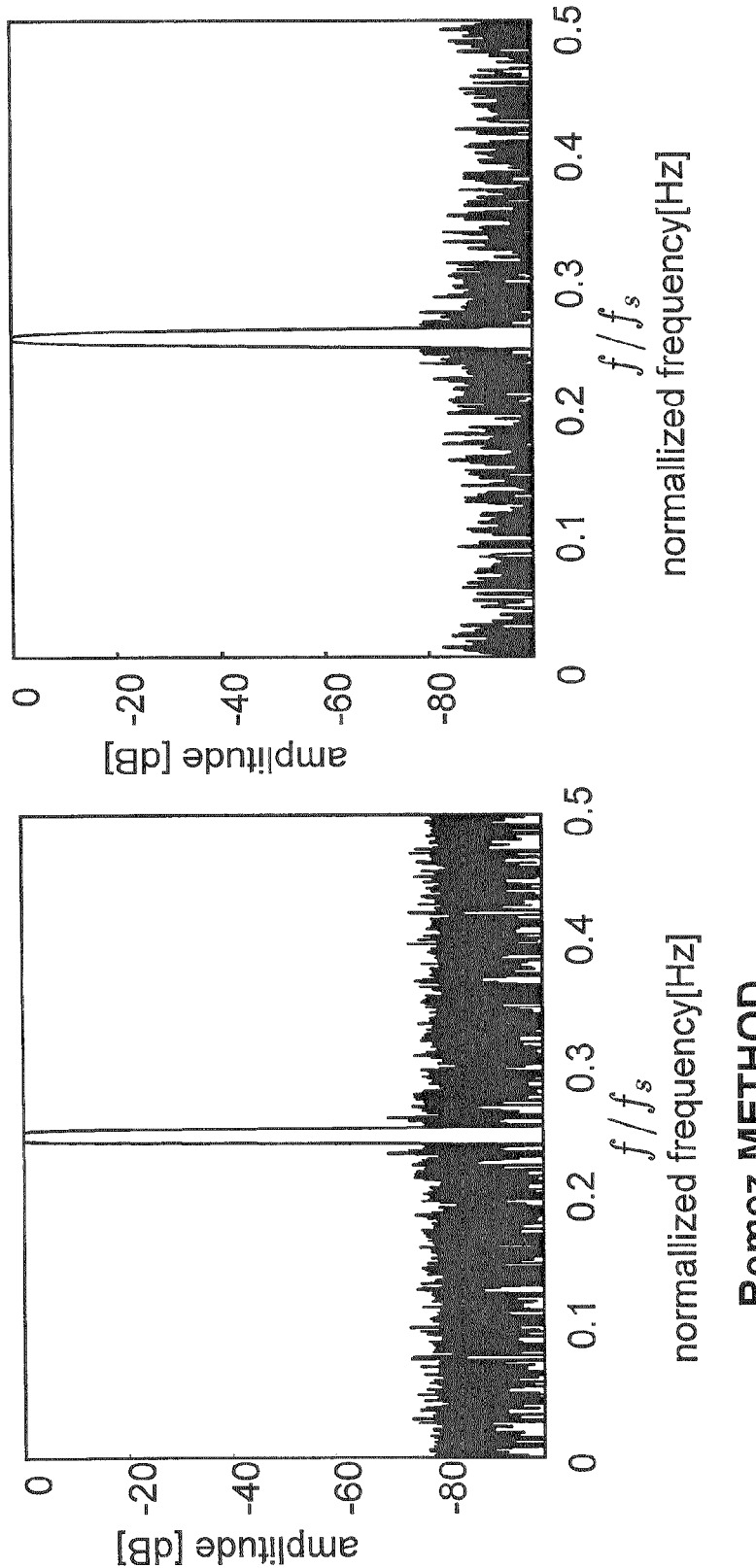
FIG. 30 is a frequency characteristics diagram of a filter designed by each method after coefficient quantization.

FIG. 30 is a frequency characteristics diagram of filters designed by the methods after coefficient quantization.

The left graph clearly shows that the Remez method produces errors throughout the stopband.

The right graph shows that the filter according to the present invention produces just a few errors in the transition band.

FIG. 31 shows the characteristics of the filter according to the present invention, evaluated against the requirements.

As shown in the figure, the filter according to the present invention can be implemented with a much smaller number of taps in comparison with the conventional method.

10. Supplement

A filter configuration (design) method or filter configuration (design) apparatus or system according to the present invention can be provided by a filter configuration (design) program for executing each procedure on a computer, a computer-readable recording medium having the filter configuration (design) program recorded on it, a program product that includes the filter configuration (design) program and can be loaded into the internal memory of the computer, a server or any other computer that includes the program, and the like.

11. Filters $G_{pass}$, $G_{stop}$, G

Figure 33:
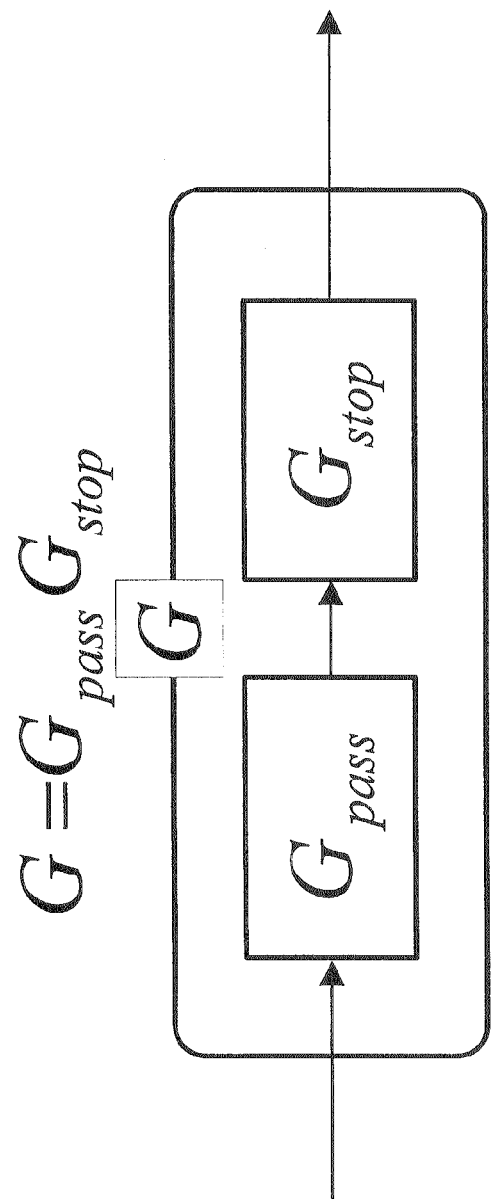
FIG. 33 is a circuit diagram of a filter G.

FIG. 33 is a circuit diagram of a filter G.

Figure 34:
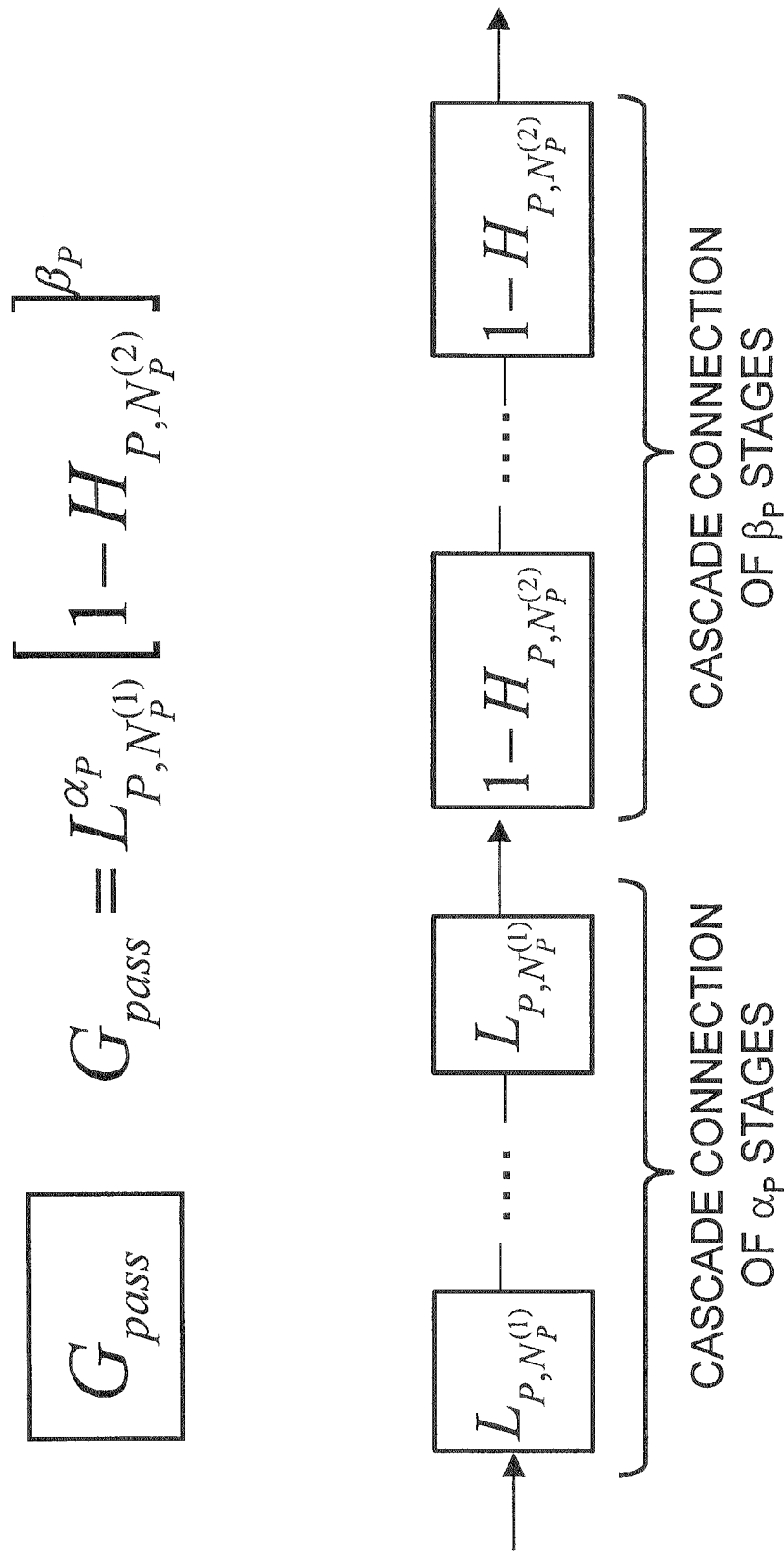
FIG. 34 is a circuit diagram of $G_{pass}$.

FIG. 34 is a circuit diagram of $G_{pass}$.

Figure 35:
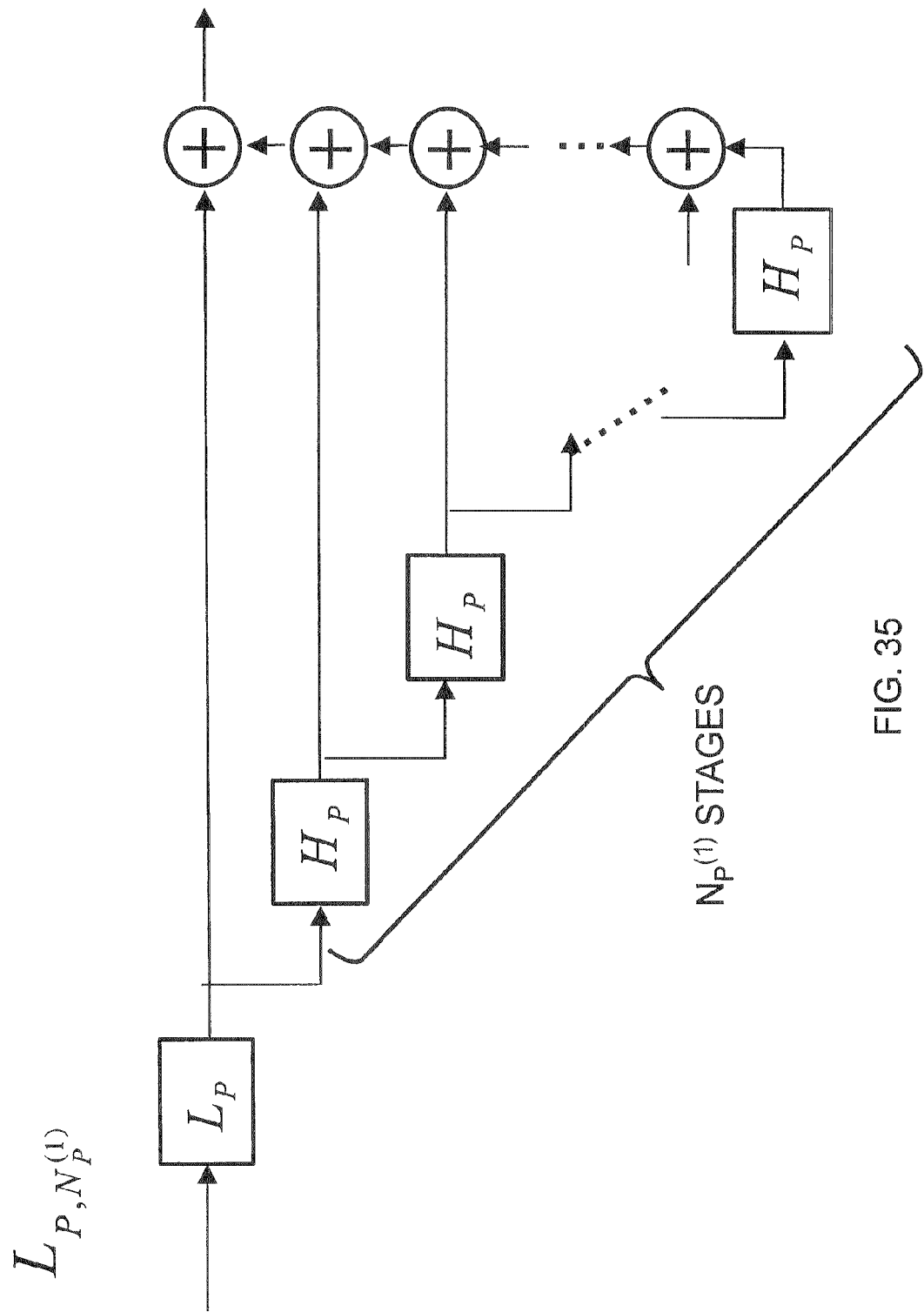
FIG. 35 is an expanded view of $G_{pass}$, related to a first term of $G_{pass}$.
Figure 36:
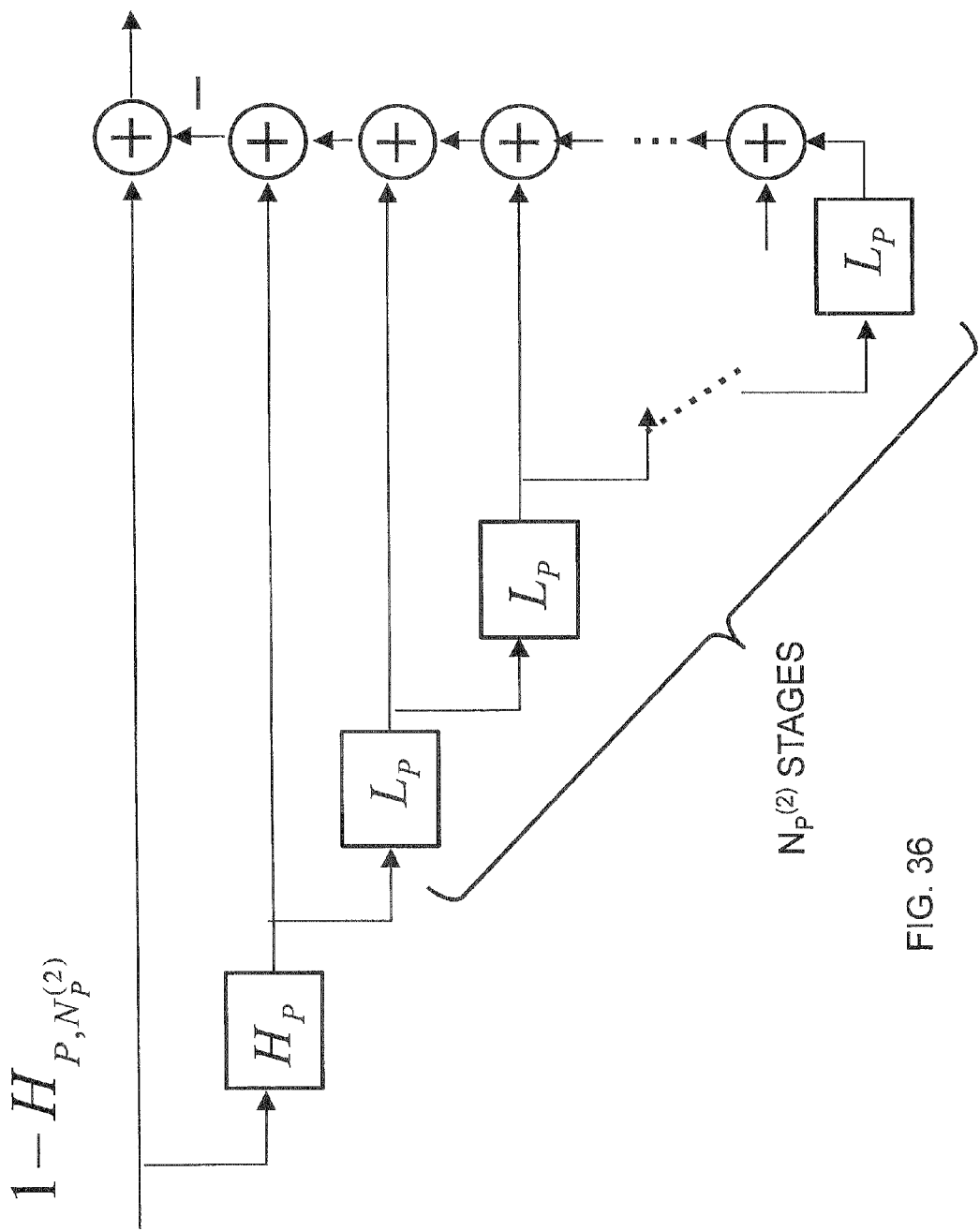
FIG. 36 is an expanded view of $G_{pass}$, related to a second term of $G_{pass}$.

FIGS. 35 and 36 are expanded views of $G_{pass}$. FIG. 35 shows a part related to a first term of $G_{pass}$. FIG. 36 shows a part related a second term of $G_{pass}$.

With $L_m$ and $H_m$ described above, the filter passband main part $G_{pass}$ is formed as indicated below.

$G_{pass}$ is expressed by the equation given below.

$$G_{pass} = L_{P,N_P(1)}^{\alpha_P}[1 - H_{P,N_P(2)}]^{\beta_P}$$ [Expression 28]

where the superscripts and subscripts of $G_{pass}$ indicate the following:

$\alpha_P$, $\beta_P$: Exponential value (indicating that identical $L_{P,N_1}$ or $[1-H_{P,N_2}]$ is connected $\alpha_P$ or $\beta_P$ times. Here, $N1 = N_P^{(1)}$ and $N2 = N_P^{(2)}$ for the sake of convenience of description), $N_P^{(1)}$: Number of $H_P$ ladder connection stages in $L_{P,N_1}$ (indicating the number of diagonal connection stages in FIG. 35), $N_P^{(2)}$: Number of $L_P$ ladder connection stages in $[1-H_{P,N2}]$ (indicating the number of diagonal connection stages in FIG. 36), P: Filter formed by scaling the frequency by P+1.

Scaling is expressed by the equation below.

$$L_P(f)=L_0((P+1)f), H_P(f)=H_0((P+1)f) \quad \text{[Expression 29]}$$

Figure 37:
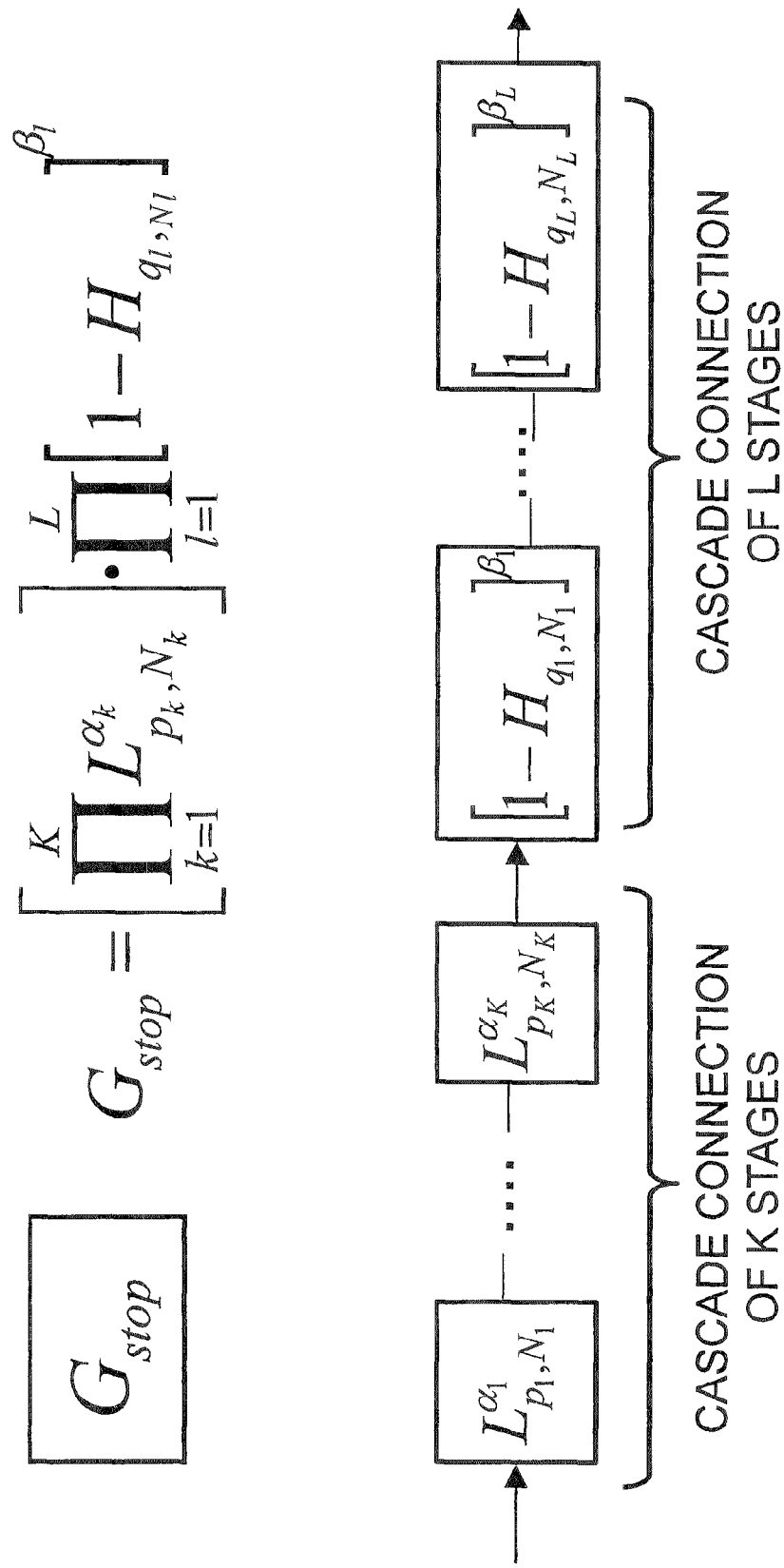
FIG. 37 is a circuit diagram of $G_{stop}$.

FIG. 37 is a circuit diagram of $G_{stop}$.

With $L_m$ and $H_m$ described above, the stopband main part $G_{stop}$ is also formed as indicated below.

$G_{stop}$ is expressed by the equation given below.

$$G_{stop} = \left[\prod_{k=1}^{K} L_{p_k,N_k}^{\alpha_k}\right] \cdot \prod_{l=1}^{L} [1-H_{q_l,N_l}]^{\beta_l} \quad \text{[Expression 30]}$$

where $\alpha_k$, $\beta_l$: Exponential value (indicating that identical $L_{pk,Nk}$ or $[1-H_{ql,Nl}]$ is connected $\alpha_k$ or $\beta_l$ times).

$N_k$: Number of $H_p$ ladder connection stages in $L_{pk,Nk}$ (indicating the number of diagonal connection stages (corresponding to $N_p^{(1)}$) in FIG. 35)

$N_l$: Number of $L_p$ ladder connection stages in $[1-H_{ql,Nl}]$ (indicating the number of diagonal connection stages (corresponding to $N_p^{(2)}$) in FIG. 36)

$p_k$, $q_l$: Filter formed by scaling the frequency by $p_k+1$ or by $q_l+1$.

The modules $L_{pk,Nk}$ and $[1-H_{ql,Nl}]$ in the high-pass filter have the same structures as the modules $$L_{P,N_P}^{(1)} \text{ or } 1-H_{P,N_P}^{(2)} \quad \text{[Expression 31]}$$

in the low-pass filter.

Figure 38:
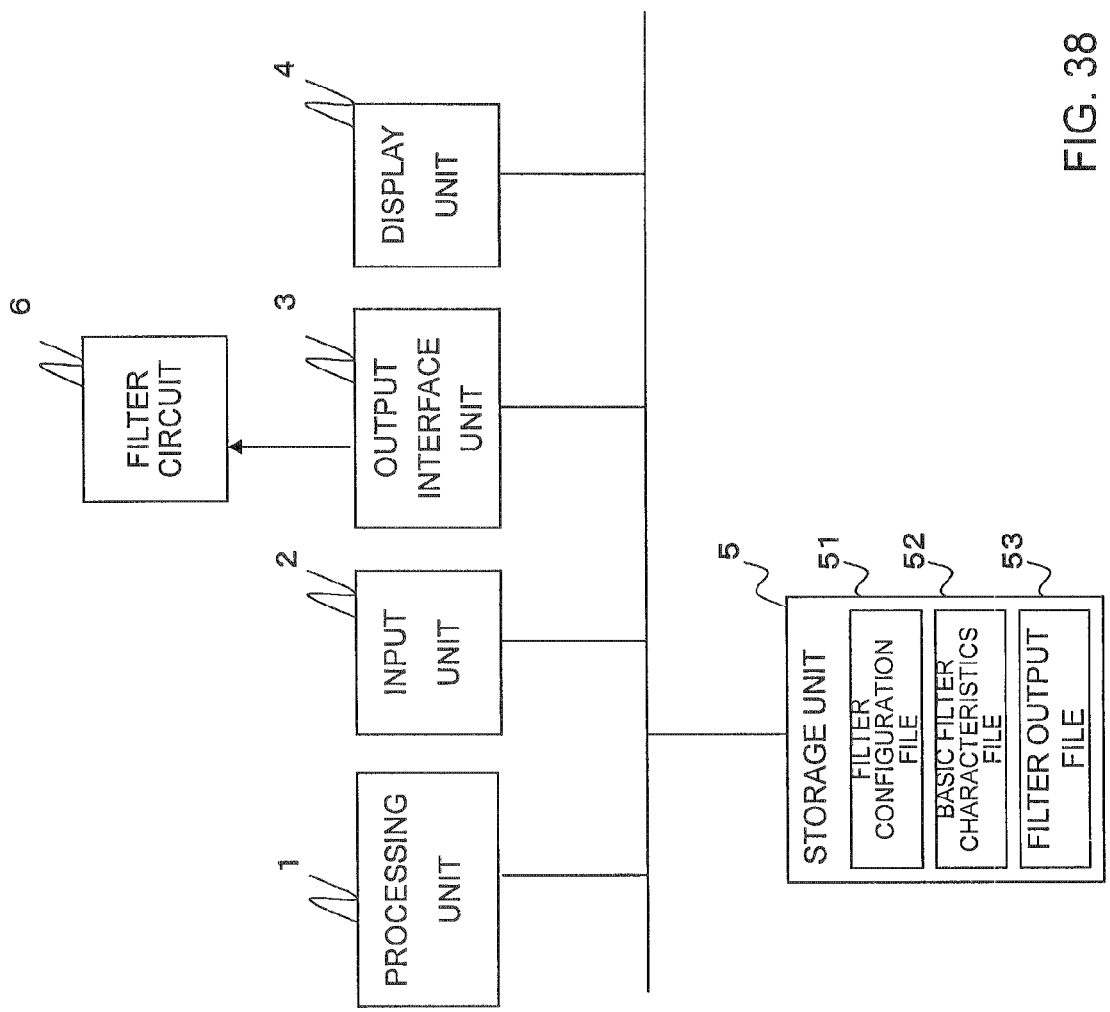
FIG. 38 is a structural view of hardware related to the embodiment.

FIG. 38 is a structural view of hardware related to the embodiment.

The hardware includes a processing unit 1, which is a central processing unit (CPU), an input unit 2, an output interface unit 3, a display unit 4, a storage unit 5, and a filter circuit 6. The processing unit 1, input unit 2, output interface unit 3, display unit 4, and storage unit 5 are connected by a star, bus, or another connection means.

The storage unit 5 includes a filter configuration file 51 that stores design specifications and requirements (such as conditions (range, value, ratio, etc) of the passband and stopband, the upper limit $N_{pass}$ of the number of multipliers, etc.), a basic filter characteristics file 52 that stores the characteristics of the basic low-pass filter, the scaled low-pass filters ($L_0$, $L_1$, ... $L_m$, ...), the basic high-pass filter, and the scaled high-pass filters ($H_0$, $H_1$, ..., $H_m$, ...), and a filter output file 53 that stores data and parameters (such as the filter coefficients $N_{pass}$, $N_p^{(1)}$, $N_p^{(2)}\alpha_p$, $\beta_p$, P, $N_k$, $N_1$, $\alpha_{pk}$, $\beta_{p1}$, $p_k$, $q_1$ of multipliers etc.) for determining a designed filter configuration, and intermediate results, final results, and so on by the processing unit 1, such as the designed filter characteristics. The processing unit 1 can output these data items (for example, data and parameters for determining the filter configuration, such as the filter coefficients of multipliers) through the output interface unit 3 to the filter circuit 6. The filter circuit 6 is configured by software or hardware and implements a filter having the specified characteristics in accordance with the data items set up through the output interface unit 3 by the processing unit 1.

12. Filter Design Procedure (Low-Pass Filter)

Figure 39:
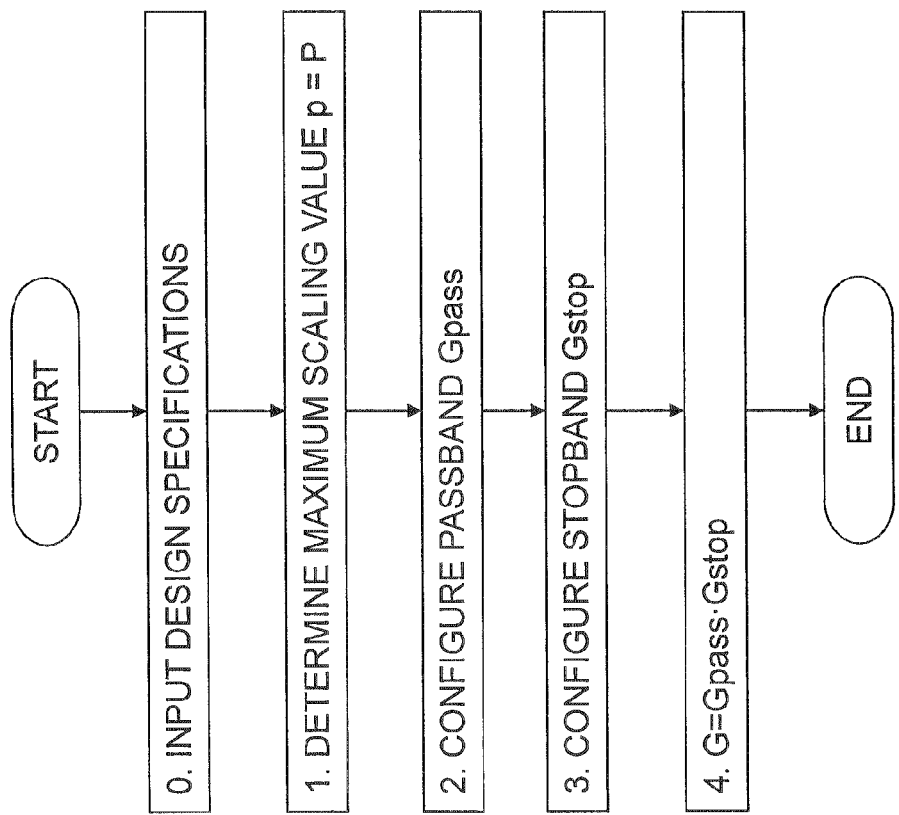
FIG. 39 is a flowchart of a filter design procedure (low-pass filter).

FIG. 39 is a flowchart of a filter design procedure (low-pass filter).

This flowchart includes the following steps:
0. Input design specifications (S0)
1. Determine the maximum scaling value p=P (S1)
2. Configure passband section $G_{pass}$ (S2)
3. Configure stopband section $G_{stop}$ (S3)
4. $G=G_{pass} \cdot G_{stop}$ (S4)

The steps will be described next in detail.

0. Input Design Specifications (S0)

The processing unit 1 specifies beforehand design specifications (conditions (range, value, ratio, etc) of the passband and stopband, the upper limit $N_{pass}$ of the number of multipliers, etc.) by storing them in the storage unit 5 (filter configuration file 51) through operations from the input unit 2 or by reading the values stored in the storage unit 5 (filter configuration file 51) beforehand.

Figure 40:
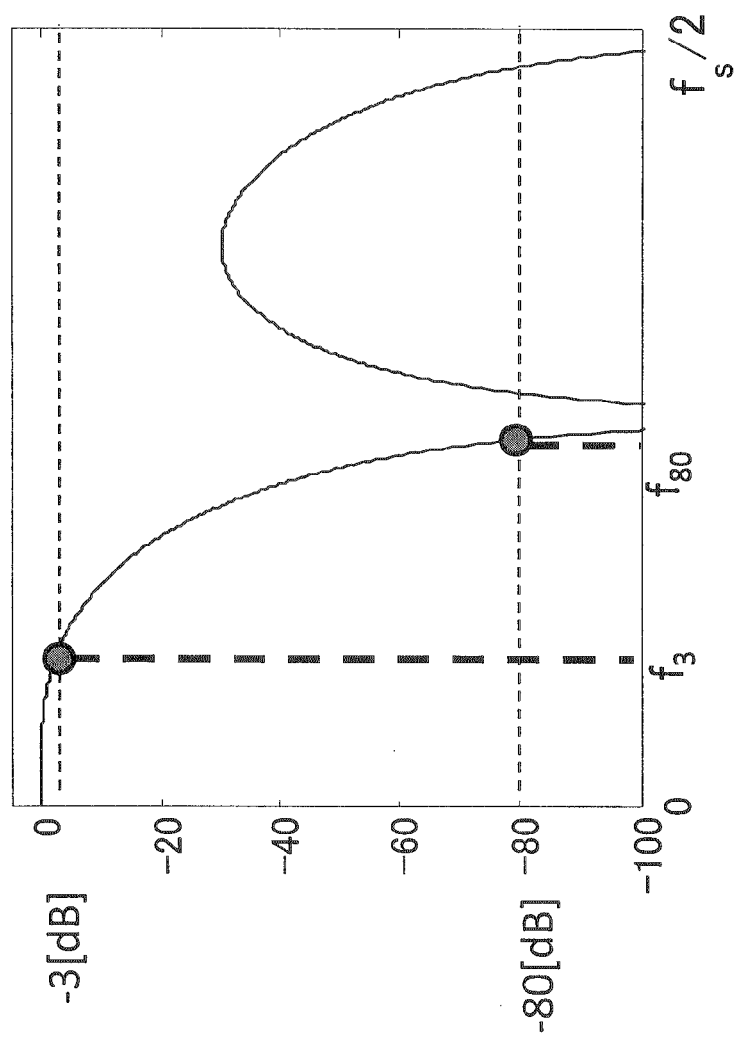
FIG. 40 is a view showing the cutoff characteristics by a cascade connection model G(f) of a product-sum module.

FIG. 40 is a graph showing the cutoff characteristics of a cascade connection model G(f) of a product-sum module.

In the figure, $f_3$ and $f_{80}$ indicate the following:

$f_3$: Frequency that crosses the −3 dB line (point of frequency crossing the −3 dB line first on the right of f=0)

$f_{80}$: Frequency that crosses the −80 dB line (point of frequency crossing the −80 dB line first on the left of $f=f_s/2$)

The ratio R of the passband frequency to the stopband frequency ($0<R\le1$) is defined as $R=f_3/f_{80}$.

As the value of R approaches 1, the steepness increases. Steep cutoff characteristics is expressed by the ratio $R(0<R\le1)$ between $f_3$ and $f_{80}$, as in the equation given below, for example.

$$R=f_3/f_{80}\approx 1$$

The processing unit 1 can specify the design specifications as follows:

Passband: −3 dB or higher at $[0, f_3]$

Stopband: −80 dB or lower at $[f_{80}, 1]$ $R \ge R_0$ (The obtained filter ratio R is larger than or equal to a predetermined ratio $R_0$.)

where $$0<f_3<f_{80}<1$$

$$0<R_0\le 1$$

Step S1. (Determine the Maximum Value of p)

In step S1, the processing unit 1 reads specified values such as $f_3$ from the storage unit 5 (filter configuration file 51) and selects the maximum scaling value p=P in accordance with the given $f_3$. The processing unit 1 may allow the P value to be predetermined by the input unit 2 or storage unit 5 (filter output file 53).

The processing unit 1 regards $f_3^{(p)}$ as the −3 dB point of $L_p$, calculates $f_3^{(0)}$ in advance, and specifies the minimum value of p that satisfies the following as P.

$$f_3^{(p)} = \frac{f_3^{(0)}}{1+p} < f_3 \quad \text{[Expression 32]}$$

The processing unit 1 stores the obtained value of P in the storage unit 5 (filter output file 53).

Step S2. Configure the Passband Main Part

The processing unit 1 reads the values specified in step S1, such as $N_{pass}$ and $R_0$, from the storage unit 5 (filter configuration file 51, filter output file 53) and selects a set of values that satisfies the design specifications ($R \ge R_0$, for example) and minimizes the number of multipliers on a round-robin basis of $$(N_p^{(1)}, N_p^{(2)}, \alpha_p, \beta_p) \subset \{0, 1, 2, \ldots\}$$

such that the maximum number of multipliers $N_{pass} \in \{1, 2, \ldots\}$ specified by $$G_{pass} = L_{P,N_P^{(1)}}{}^{\alpha_P}[1-H_{P,N_P^{(2)}}]^{\beta_P} \quad \text{[Expression 33]}$$

is not exceeded.

For example, the processing unit 1 reads the characteristics of the low-pass filter and high-pass filter determined by $N_p^{(1)}$, $N_p^{(2)}$, $\alpha_p$, $\beta_p$, from the storage unit 5 (basic filter characteristics file 52), calculates the characteristics of $G_{pass}$ by the equation given above, and selects the set that satisfies the design specifications ($R \geq R_0$, for example) and minimizes the number of multipliers on a round-robin basis. The processing unit 1 may select a set that also conforms to the design specifications of the passband and stopband.

However, the following rules of combination are defined.
$(\alpha_p, \beta_p) \neq (0, 0)$
$N_p^{(1)} = 0 \Rightarrow \alpha_p = 0$
$N_p^{(2)} = 0 \Rightarrow \beta_p = 0$
The numbers of multipliers are obtained as follows.

The number of multipliers of $L_{P,N_P^{(1)}}{}^{\alpha_P} = 5N_P^{(1)}\alpha_P$ The number of multipliers of $[1-H_{P,N_P}{}^{\alpha_P}]^{\beta_P} 5N_P^{(2)}\beta_P$ [Expression 34]

Those multipliers include a multiplier whose coefficient is 1. If the multiplier with a coefficient of 1 is excluded, a conditional expression for limiting the number of multipliers up to $N_{pass}$ is given as follows.

$$4(N_p^{(1)}\alpha_p + N_p^{(2)}\beta_p) \leq N_{pass}$$

The processing unit 1 stores the obtained $N_p^{(1)}$, $N_p^{(2)}$, $\alpha_p$, $\beta_p$ in the storage unit 5 (filter output file 53).

Step S3. Configure Stopband Section

The processing unit 1 selects a set of values that satisfies the design specifications ($R \geq R_0$, for example) and minimizes the number of multipliers by calculating $$G = G_{pass} G_{stop}$$

on a round-robin basis of $(N_k, N_l, \alpha_{pk}, \beta_{ql}) \subset \{0, 1, 2, \ldots, \}$ when $$G_{stop} = \left[\prod_{k=1}^{K} L_{p_k,N_k}^{\alpha_{p_k}}\right] \cdot \prod_{l=1}^{L} [1-H_{q_l,N_l}]^{\beta_{q_l}} \quad \text{[Expression 35]}$$

here, $p_k, q_l \subset \{0, 1, 2, \ldots\}, \quad K, L \leq P-1,$

For example, the processing unit 1 reads the characteristics of the low-pass filter and high-pass filter determined by $N_k$, $N_l$, $\alpha_{pk}$, $\beta_{ql}$ from the storage unit 5 (basic filter characteristics file 52), calculates the characteristics of $G_{stop}$ by the equation given above, calculates $$G = G_{pass} G_{stop}$$

on a round-robin basis, and selects a set that satisfies the design specifications ($R \geq R_0$, for example) and minimizes the number of multipliers. The processing unit 1 may select a set that also conforms to the design specifications of the passband and stopband.

The processing unit 1 stores the obtained $N_k$, $N_l$, $\alpha_{pk}$, $\beta_{ql}$ in the storage unit 5 (filter output file 53).

Step S4. Configure and Output G

The processing unit 1 reads from the storage unit 5 (filter output file 53) the specifications data and parameters for configuring the filter, such as $N_p^{(1)}$, $N_p^{(2)}$, $\alpha_p$, $\beta_p$, $N_k$, $N_l$, $\alpha_{pk}$, $\beta_{ql}$, reads also from the storage unit 5 (basic filter characteristics file 52) the characteristics of the basic low-pass filter, the corresponding filters formed by scaling it, the basic high-pass filter, and the corresponding filters formed by scaling it, forms $G_{pass}$ and $G_{stop}$ as expressed by the equations given above, forms the filter G by calculating $G = G_{pass} G_{stop}$, and displays the characteristics of the filter G on the display unit 4 or stores the characteristics in the storage unit 5 (filter output file 53) or both displays and stores them.

The processing unit 1 reads from the storage unit 5 (filter output file 53) the specifications data and parameters for configuring the filter, such as $N_p^{(1)}$, $N_p^{(2)}$, $\alpha_p$, $\beta_p$, $N_k$, $N_l$, $\alpha_{pk}$, $\beta_{ql}$, and outputs the values through the output interface unit 3 to the filter circuit 6. Then, the processing unit 1 may form $G_{pass}$ and $G_{stop}$ by the filter circuit 6 in accordance with the read values and equations given above to form the filter G as $G = G_{pass} G_{stop}$. The filter circuit 6 can form the filter G with a computer simulation or by software. The filter circuit 6 may also form the filter G by hardware, in accordance with the values output from the output interface unit 3.

In the description given above, the characteristics of filters formed by scaling the basic low-pass filter and the basic high-pass filter are stored in advance in the storage unit 5 (basic filter characteristics file 52). However, the characteristics of just the basic low-pass filter and the basic high-pass filter may be stored in the basic filter characteristics file 52, and the processing unit 1 may perform scaling based on the stored characteristics as needed to obtain and use the characteristics of a designated scaled filter.

13. Example of Low-Pass Filter Design (1) Basic Characteristics Improvement

Figure 45:
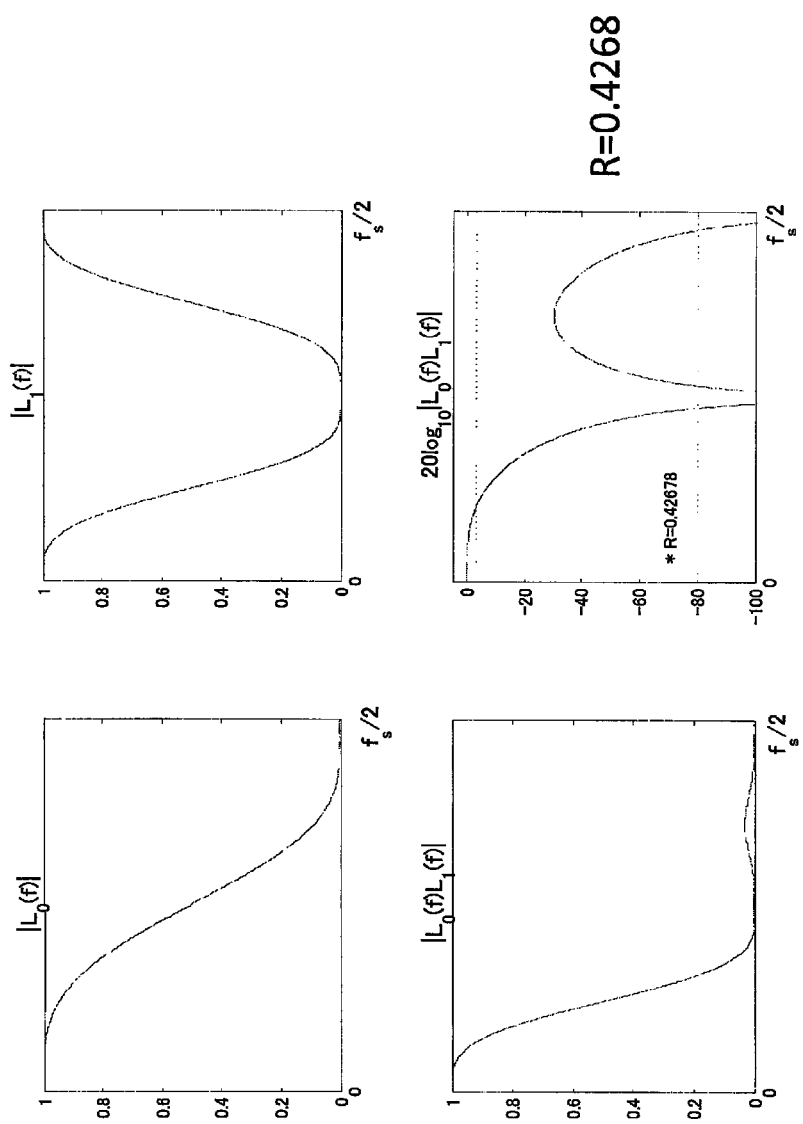
FIG. 45 is an illustration of an example (low-pass filter) in which the characteristics are improved by G(f).

FIG. 45 is an illustration of an example (low-pass filter) in which the characteristics are improved by G(f).

The figure shows the characteristics of the filter G obtained by forming the filter G(f) given by the equation below, by connecting the low-pass filters $L_0(f)$ and $L_1(f)$ in cascade.

$$G(f) = L_0(f) L_1(f)$$

The characteristics can be made steeper by connecting element filters in cascade.

(2) Example Design Through Flowchart

FIG. 41 is an illustration of the specifications of a low-pass filter.

An example configuration of the low-pass filter will now be given in accordance with the configuration means described above. The desired characteristics specifications are as shown in the figure. The passband and stopband are ranges of normalized frequency.

The configuration of the filter designed in accordance with the flowchart in this embodiment is expressed as follows.

$$G = L_{7.9}^3 L_{3.1}^1 L_{4.2}^1 L_{5.3}^1 (1-H_{1.1}^1)(1-H_{2.1}^1)$$

In this example, P=7 is selected; $\alpha_7 = 0, 1, 2, 3, 4$ and $N_7 = 0, 1, 2, 3$, and so on are tested; and $G_{pass} = L_{7.9}^3$ is specified.

Figure 42:
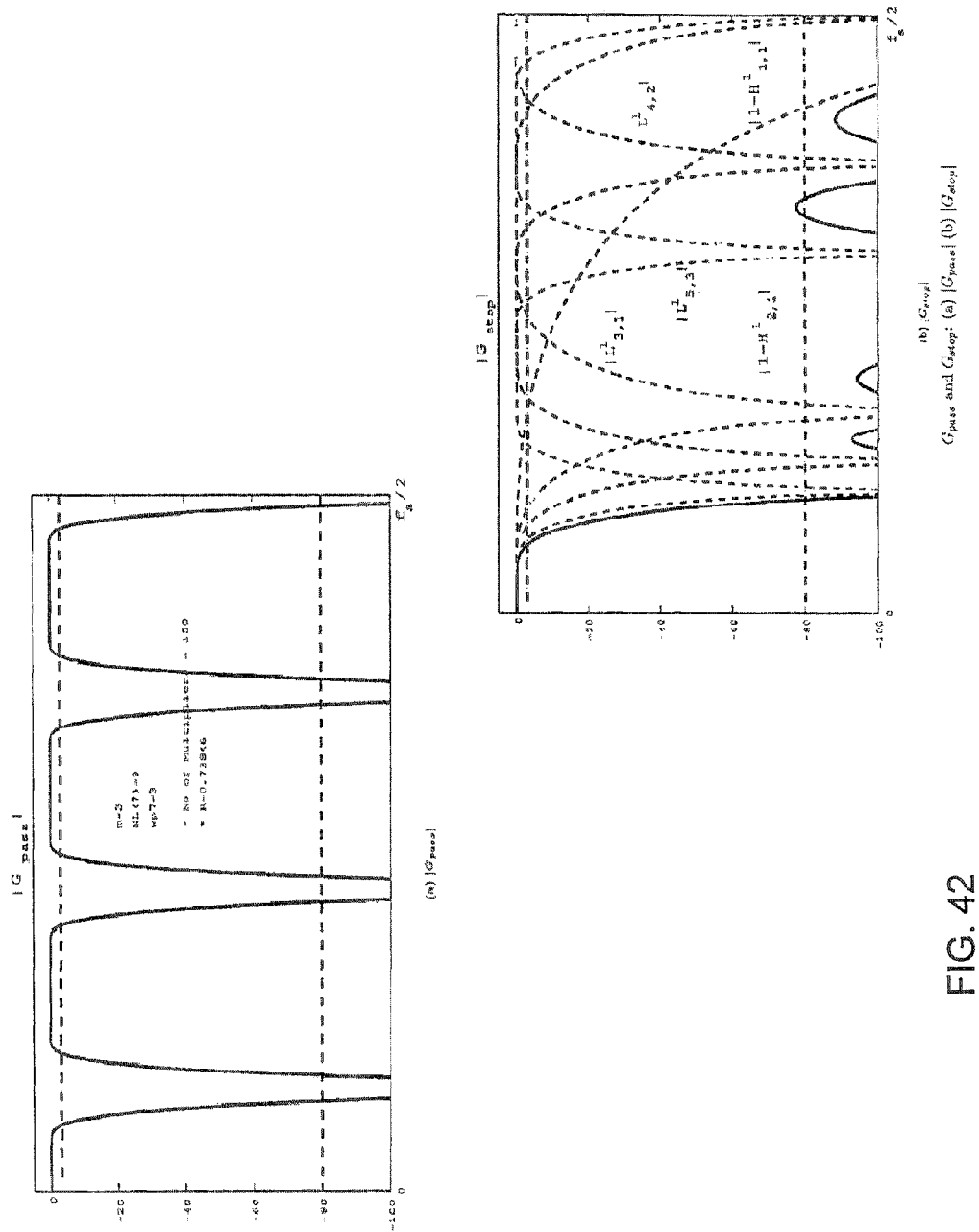
FIG. 42 is an illustration of $G_{pass}$ and $G_{stop}$ of a filter G.

FIG. 42 is an illustration of $G_{pass}$ and $G_{stop}$ of the filter G.

The characteristics diagram of $G_{pass}$ is shown in FIG. 42(a). The characteristics of $G_{pass}$ include a passband section of [0, 0.096], a stopband section of [0.013, 1], and R=0.738, and 150 multipliers are used.

In the stopband, the second to fourth side lobes of $G_{pass}$ must be blocked. The third and fourth side lobes are generally blocked by $(1-H_{1.1}^1)$ and $(1-H_{2.1}^1)$ in FIG. 26(b). Here, P≤5 is taken, and, as shown in FIG. 26(b), a part near the center of the second side lobe is blocked by $L_{3.1}^1$ and $L_{4.2}^1$, and a part near the right side is blocked by $L_{3.1}^1$ and $1-H_{2.1}^1$. To stop a part near the left side, $N_5 = 0, 1, 2, \ldots$ and $\alpha_5 = 0, 1, 2$, etc. are tested against p=5, and ($\alpha_5$, $N_5$)=(1, 3) is selected in keeping with the number of multipliers.

Figure 43:
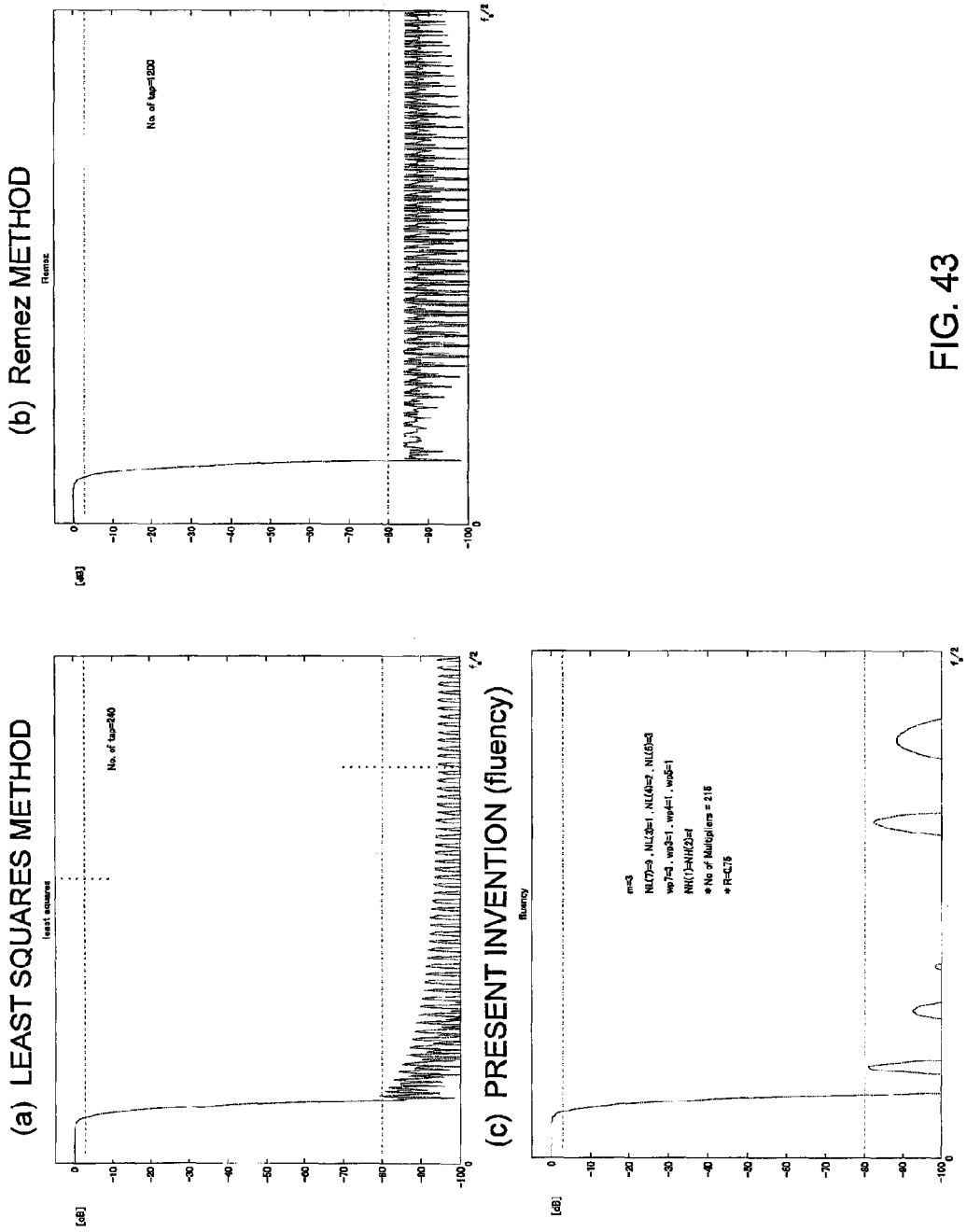
FIG. 43 shows characteristics diagrams of filters configured by conventional methods and the present invention. The least squares method is shown at (a); the Remez method is shown at (b); and a method of the present invention is shown at (c).

FIG. 43 is a characteristics diagram of filters configured by conventional methods and the present invention. The least squares method is shown at (a); the Remez method is shown at (b); and the method of the present invention is shown at (c).

FIG. 44 is a chart comparing the number of multipliers and R of the design methods. The number of multipliers here was obtained when the characteristics satisfied all the specifications for the first time. The method of the present invention is superior to the least squares method in terms of both the number of multipliers and R. The Remez method is slightly better than the method according to the present invention in R, but the number of multipliers is as large as 1142. To check superiority to the Remez method, the number of multipliers was calculated when the R value exceeded R=0.762 of the Remez method (R=0.767, here). It was 365.

This result verifies the validity of the approximation model of steep low-pass filter characteristics, made by a cascade connection of element filters formed of the product-sum modules according to the present invention.

INDUSTRIAL APPLICABILITY

As the impulse response function described above, an m-th-degree piecewise polynomial can be used, for example. An interpolation function with waveform adjustment parameters or the like can also be used.

The present invention can be applied to a variety of technologies such as acoustic technologies, video technologies, image technologies, transmission technologies, communication technologies, analog-to-digital conversion and digital-to-analog conversion technologies, compression and decompression technologies, encryption and decryption (decompression) technologies, and filter technologies.

The present invention can be used in acoustic, image, communication, and other signal processing filters in wide areas.

The present invention can be used in wide range of apparatuses such as acoustic equipment that includes amplifiers, image apparatuses for moving or still picture processing, communication devices such as mobile phones, controllers, computers, and PCs.

The invention claimed is:

1. A filter for providing desired characteristics, the filter comprising a combination of a plurality of scaled filters, where said scaled filters are formed by scaling at least one basic filter in the time domain or the frequency domain, wherein said at least one basic filter comprises at least one of a basic low-pass filter and a basic high-pass filter, wherein said at least one basic filter has an impulse response function expressed by a finite piecewise polynomial and wherein said at least one basic filter has a filter coefficient which is derived from a sample point of said impulse response function; wherein said combination of the plurality of scaled filters is selected such that a passband width of said combination is larger than or equal to a predetermined range; and wherein the combination of the plurality of scaled filters is configured to form a passband filter and a stopband filter, wherein said formed pastband filter has passband characteristics satisfying predetermined required characteristics and wherein said formed stopband filter has stopband characteristics satisfy predetermined required characteristics.

2. A filter according to claim 1, wherein said basic filter is configured to sequentially add received signals delayed by multiplying a discrete input in a finite interval by a coefficient a number of delay elements in the basic filter is increased or decreased to form said passband filter and said stopband filter; and wherein the scaled filter(s) are connected in cascade in the order in which filter bandwidth changes in stages and to output signals.

3. A filter according to claim 1, wherein scaled filters formed by scaling the basic low-pass filter and the basic high-pass filter in frequency are selected such that the passband width is equal to a predetermined required width or larger, and, by connecting the selected scaled filters in cascade, a passband filter is formed such that the passband characteristics satisfy predetermined required characteristics and a stopband filter is formed such that the stopband characteristics satisfy predetermined required characteristics.

4. A filter according to claim 1, wherein scaled filters formed by scaling the basic low-pass filter and the basic high-pass filter in frequency are selected such that the passband width is equal to a predetermined required width or larger, and, by the selected scaled filters, a passband characteristics filter is provided, by selecting a scaled low-pass filter that satisfies required characteristics, and connecting the scaled high-pass filters in cascade to the selected scaled low-pass filter.

5. A filter according to claim 1, wherein scaled filters formed by scaling the basic low-pass filter and the basic high-pass filter in frequency are selected such that the passband width is equal to a predetermined required width or larger, and, by the selected scaled filters, a passband characteristics filter is provided, by selecting a scaled high-pass filter that satisfies required characteristics, and connecting the scaled low-pass filters in cascade to the selected scaled high-pass filter.

6. A filter according to claim 1, wherein at a maximum degree of scaling of said at least one basic filter that satisfies a predetermined passband width, the maximum scaling value P, which is the number of delay elements inserted into the scaled filters, is the minimum value of p that satisfies the following expression:

$$f_3^{(p)} = \frac{f_3^{(0)}}{1+p} < f_3 \qquad \text{[Expression 1]}$$

where $f_3$ is a frequency (given by design specifications) that crosses a −3 dB line, $f_3^{(0)}$ is a (predetermined) −3 dB point of the basic low pass filter $L[_p]_o$, and $f_3^{(p)}$ is a −3 dB point of a low pass filter $L_p$ formed by scaling the basic low pass filter.

7. A filter according to claim 4, wherein a correction filter whose required characteristics are equal to stopband characteristics is formed by the scaled filters, and wherein the correction filter is connected to the passband characteristics filter in cascade.

8. A filter according to claim 5, wherein a correction filter whose required characteristics are equal to stopband characteristics is formed by the scaled filters, and wherein the correction filter is connected to the passband characteristics filter in cascade.

9. An FIR filter for providing desired characteristics, the filter comprising a combination of a plurality of scaled filters, wherein said scaled fillers are formed by scaling basic filters in the time domain or the frequency domain based on provided input design characteristics for filter configuration; wherein said provided input design characteristics comprise a center frequency, a cutoff frequency, a stopband frequency, a maximum attenuation degree in a stopband, and a sampling frequency, wherein one of said basic filters comprises a basic low-pass filter and wherein another of said basic filters comprises a basic high-pass filter; wherein each basic filter has an impulse response function expressed by a finite piecewise polynomial and wherein each basic filter has a filter coefficient which is derived from a sample point of said impulse response function; and wherein said scaled filters are formed by scaling on the basis of a scaling factor of the highest degree; wherein said scaling factor of the highest degree is determined from a passband frequency width; said passband frequency being determined by the cutoff frequency and the center frequency;

wherein scaled filters formed by scaling on the basis of a scaling factor of a degree lower than the the highest degree are sequentially selected;

wherein said scaled filters are selected to keep an attenuation degree at the stopband frequency of the FIR filter lower than or equal to the maximum attenuation degree;

the FIR filter is configured by a sequential cascade connection of the selected scaled filters; and wherein a filter gain at a frequency determined by the ratio of the sampling frequency and (scaling factor +1) is obtained as the maximum stopband attenuation degree.

10. A filter according to claim 9, wherein the filter coefficient is quantized, wherein the passband frequency width, an attenuation degree at the cutoff frequency, and the stopband attenuation degree are re-calculated by the quantized coefficient, and wherein an increased or decreased number of scaled filters are combined to keep an error of each of the above values caused by quantization within a permissible range.

11. A filter according to claim 9, wherein a scaling factor of highest degree, which is a number of delay elements inserted into the scaled filters, is determined from the ratio between the passband frequency width of the basic filter(s) and the passband frequency width of a filter to be formed by scaling the basic filters.

12. A filter according to claim 9, further comprising a filter which is identical to a selected scaled filter is connected in cascade therewith if a filter gain at the stopband frequency of the filter decreases when the selected scaled filter is so connected.

13. A filter according to claim 9, wherein at a maximum degree of scaling of said at least one basic filter that satisfies a predetermined passband width, the maximum scaling value P, which is the number of delay elements inserted into the scaled filters, is the minimum value of p that satisfies the following expression:

$$f_3^{(p)} = \frac{f_3^{(0)}}{1+p} < f_3 \qquad \text{[Expression 1]}$$

where $f_3$ is a frequency (given by design specifications) that crosses a −3 dB line, $f_3^{(0)}$ is a (predetermined) −3 dB point of the basic low pass filter $L[_p]_o$, and $f_3^{(p)}$ is a −3 dB point of a low pass filter $L_p$ formed by scaling the basic low pass filter.

14. A method of configuring a filter for providing desired characteristics, the method comprising providing at least one basic filter in the time domain or the frequency domain, wherein said at least one basic filter comprises at least one of a basic low-pass filter and a basic high-pass filter, wherein said at least one basic filter has an impulse response function expressed by a finite piecewise polynomial and wherein said at least one basic filter has a filter coefficient which is derived from a sample point of said impulse response function;

scaling said at least one basic filter in the time domain or the frequency domain to form a plurality of scaled filters; [and]

selecting a combination of said scaled filters such that a passband width of said combination is larger than or equal to a predetermined range; and further comprising configuring a combination of the scaled filters to form a passband filter and a stopband filter, wherein said formed pastband filter has passband characteristics satisfying predetermined required characteristics and wherein said formed stopband filter has stopband characteristics satisfy predetermined required characteristics.

\* \* \* \* \*